US012666741B2

(12) United States Patent
Choi et al.

(10) Patent No.: US 12,666,741 B2
(45) Date of Patent: Jun. 23, 2026

(54) IMAGE SENSOR

(71) Applicant: Samsung Electronics Co., Ltd.,
Suwon-si (KR)

(72) Inventors: Hyuk Soon Choi, Seongnam-si (KR);
Sang-Su Park, Seoul (KR); **Hee Sung
Shim, Seoul (KR); Dae Kun Ahn**,
Seoul (KR); Min-Jun Choi,
Hwaseong-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 378 days.

(21) Appl. No.: 17/887,887

(22) Filed: Aug. 15, 2022

(65) Prior Publication Data

US 2023/0146645 A1 May 11, 2023

(30) Foreign Application Priority Data

Nov. 5, 2021 (KR) ........................ 10-2021-0151360

(51) Int. Cl.
*H10F 39/00* (2025.01)
*H10F 39/18* (2025.01)
(52) U.S. Cl.
CPC ....... *H10F 39/807* (2025.01); *H10F 39/8053*
(2025.01); *H10F 39/8063* (2025.01); *H10F
39/811* (2025.01)
(58) Field of Classification Search
CPC ........... H01L 27/1463; H01L 27/14621; H01L
27/14627; H01L 27/14636;
(Continued)

(56) References Cited

U.S. PATENT DOCUMENTS

| 7,538,371 B2 | 5/2009 | Yang |
| 7,847,847 B2 | 12/2010 | Yaung et al. |
(Continued)

FOREIGN PATENT DOCUMENTS

| EP | 3879571 A1 | 9/2021 |
| KR | 20160109514 A | 9/2016 |
(Continued)

OTHER PUBLICATIONS

European Search Report Dated Feb. 16, 2023 for corresponding EP
Patent Application No. 22 205 247.4.
(Continued)

*Primary Examiner* — Christine S. Kim
*Assistant Examiner* — Sesha Sairaman Srinivasan
(74) *Attorney, Agent, or Firm* — Harness, Dickey &
Pierce, P.L.C.

(57) ABSTRACT

An image sensor is provided. The image sensor includes a
substrate including a plurality of unit pixels, each of unit
pixels includes a photoelectric conversion element; a first
trench formed in the substrate in a lattice shape to isolate the
plurality of unit pixels; a plurality of first capacitor struc-
tures extended along a sidewall of the first trench in the first
trench, including a first electrode, a second electrode, and a
first dielectric layer between the first electrode and the
second electrode; and a first capacitor isolation pattern at a
lattice point of the first trench to isolate the plurality of first
capacitor structures.

20 Claims, 21 Drawing Sheets

(58) Field of Classification Search

CPC ......... H01L 27/14641; H01L 27/14643; H01L 27/14609; H01L 27/14603; H01L 27/14625

See application file for complete search history.

(56) References Cited

U.S. PATENT DOCUMENTS

| | | | |
|---|---|---|---|
| 8,803,057 B2 | 8/2014 | Roy et al. | |
| 9,077,922 B2 | 7/2015 | Wakano et al. | |
| 9,786,704 B2 | 10/2017 | Cheng et al. | |
| 10,638,063 B2 | 4/2020 | Borthakur | |
| 2006/0007338 A1* | 1/2006 | Wakano | H04N 25/772 |
| | | | 348/E5.079 |
| 2016/0268321 A1* | 9/2016 | Ihara | H01L 27/14612 |
| 2016/0276380 A1* | 9/2016 | Yang | H10F 39/016 |
| 2017/0179170 A1* | 6/2017 | Chung | H01L 21/76224 |
| 2017/0186806 A1* | 6/2017 | Lalanne | H10F 39/811 |
| 2019/0074349 A1* | 3/2019 | Lin | H10D 1/042 |
| 2019/0131349 A1* | 5/2019 | Im | H10F 39/802 |
| 2019/0288058 A1* | 9/2019 | Hayami | H10D 1/047 |
| 2020/0021754 A1* | 1/2020 | Borthakur | H10F 39/014 |
| 2020/0043968 A1* | 2/2020 | Hynecek | H10F 39/807 |
| 2020/0058707 A1 | 2/2020 | Choi et al. | |
| 2020/0105810 A1* | 4/2020 | Moon | H01L 31/103 |
| 2020/0212092 A1 | 7/2020 | Kwag et al. | |
| 2020/0350346 A1* | 11/2020 | Ohura | H04N 25/70 |
| 2021/0098567 A1* | 4/2021 | Kim | H01L 23/50 |
| 2021/0104569 A1* | 4/2021 | Kwak | H01L 27/14629 |
| 2021/0185251 A1 | 6/2021 | Yonemoto | |
| 2021/0335861 A1* | 10/2021 | Cheng | H01L 21/76224 |
| 2021/0343790 A1* | 11/2021 | Choi | H10F 39/199 |

FOREIGN PATENT DOCUMENTS

| | | | |
|---|---|---|---|
| KR | 20190012272 A | 2/2019 | |
| KR | 20190048568 A | 5/2019 | |

OTHER PUBLICATIONS

Office Action Dated Mar. 1, 2023 for corresponding EP Patent Application No. 22 205 247.4.

Office Action for Korean Application No. 10-2021-0151360 dated Jul. 31, 2025.

* cited by examiner

1

IMAGE SENSOR

CROSS-REFERENCE TO RELATED APPLICATION

This application claims priority from Korean Patent Application No. 10-2021-0151360 filed on Nov. 5, 2021 in the Korean Intellectual Property Office, and all the benefits accruing therefrom under 35 U.S.C. 119, the contents of which in its entirety are herein incorporated by reference.

BACKGROUND

Technical Field

The present disclosure relates to image sensors.

Description of the Related Art

An image sensor is one of semiconductor elements that convert optical information into an electrical signal. The image sensor may include a charge coupled device (CCD) image sensor and a complementary metal-oxide semiconductor (CMOS) image sensor.

The image sensor may be configured in the form of a package. In this case, the package may be configured in a structure that protects the image sensor and at the same time allows light to enter a photo receiving surface or a sensing region of the image sensor.

BRIEF SUMMARY

An object of the present disclosure is to provide image sensors that have improved reliability in a product.

According to some example embodiments of the present disclosure, an image sensor includes a substrate including a plurality of unit pixels, each of unit pixels includes a photoelectric conversion element; a first trench formed in the substrate in a lattice shape to isolate the plurality of unit pixels; a plurality of first capacitor structures extended along a sidewall of the first trench in the first trench, including a first electrode, a second electrode, and a first dielectric layer between the first electrode and the second electrode; and a first capacitor isolation pattern at a lattice point of the first trench to isolate the plurality of first capacitor structures.

According to some example embodiments of the present disclosure, an image sensor includes a substrate including a first unit pixel and a second unit pixel adjacent to the first unit pixel in a first direction; a first trench extended in a second direction inside the substrate to isolate the first unit pixel from the second unit pixel, including a first sidewall and a second sidewall, which are opposite to each other in the first direction; and a first capacitor structure including a first electrode extended along the first sidewall of the first trench, a second electrode extended along the second sidewall of the first trench, and a first dielectric layer between the first electrode and the second electrode.

According to some example embodiments of the present disclosure, an image sensor includes a substrate including a plurality of unit pixels, each of which includes a photoelectric conversion element, including a first surface and a second surface, which are opposite to each other; a first trench surrounding the periphery of each of the plurality of unit pixels inside the substrate and isolating the plurality of unit pixels; a first insulating layer on one sidewall of the first trench; a second insulating layer on the other sidewall of the first trench; a plurality of first capacitor structures filling the first trench between the first insulating layer and the second insulating layer, extended along an extended direction of the first trench, and including a first electrode, a second electrode, and a first dielectric layer between the first electrode and the second electrode; a first capacitor isolation pattern at an intersection point of the first trench to isolate the plurality of first capacitor structures; a wiring structure on the second surface of the substrate, including a first contact connected to the first electrode and a second contact connected to the second electrode; and a color filter and a micro lens, which are sequentially stacked on the first surface of the substrate.

The objects of the present disclosure are not limited to those mentioned above, and additional objects of the present disclosure, which are not mentioned herein, will be clearly understood by those skilled in the art from the following description of the present disclosure.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE DISCLOSURE

Figure 1:
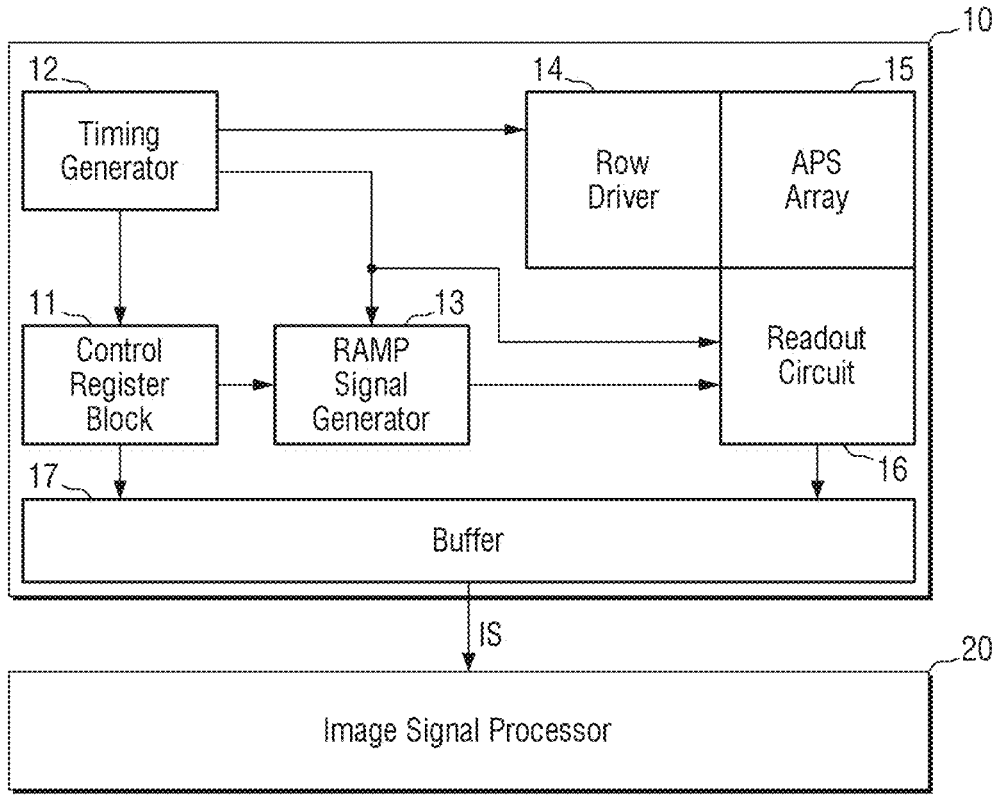
FIG. 1 is a block view illustrating an image sensing device according to some example embodiments of the present disclosure.

FIG. 1 is a block view illustrating an image sensing device according to some example embodiments of the present disclosure.

Referring to FIG. 1, an image sensing device 1 according to some example embodiments may include an image sensor 10 and an image signal processor 20.

The image sensor 10 may generate an image signal IS by sensing an image of a sensing target using light. In some example embodiments, the generated image signal IS may be, for example, a digital signal, but the example embodiments according to technical spirits of the present disclosure is not limited thereto.

The image signal IS may be provided to the image signal processor 20 and then processed by the image signal processor 20. The image signal processor 20 may receive the image signal IS output from a buffer 17 of the image sensor 10 and process the received image signal IS to be easily displayed.

In some example embodiments, the image signal processor 20 may perform digital binning for the image signal IS output from the image sensor 10. At this time, the image signal IS output from the image sensor 10 may be a raw image signal from an active pixel sensor array 15 (APS array) without analog binning, or may be the image signal IS for which analog binning has been already performed.

In some example embodiments, the image sensor 10 and the image signal processor 20 may be disposed to be detached from each other as shown. For example, the image sensor 10 may be embedded in a first chip, and the image signal processor 20 may be embedded in a second chip, whereby the image sensor 10 and the image signal processor 20 may perform communication with each other through a predetermined (or, alternatively, desired) interface. However, the example embodiments are not limited to this, and the image sensor 10 and the image signal processor 20 may be implemented by one package, for example, a multi-chip package (MCP).

The image sensor 10 may include an active pixel sensor array 15, a control register block 11, a timing generator 12, a row driver 14, a readout circuit 16, a ramp signal generator 13, and a buffer 17.

The control register block 11 may control overall operations of the image sensor 10. Particularly, the control register block 11 may directly transmit an operation signal to the timing generator 12, the ramp signal generator 13 and the buffer 17.

The timing generator 12 may generate a reference signal that becomes a reference of an operation timing of various elements of the image sensor 10. The operation timing reference signal generated by the timing generator 12 may be transferred to the ramp signal generator 13, the row driver 14, the readout circuit 16, etc.

The ramp signal generator 13 may generate and transmit a ramp signal used in the readout circuit 16. For example, readout circuit 16 may include a correlation double sampler (CDS), a comparator, etc. The ramp signal generator 13 may generate and transmit a ramp signal used in the correlation double sampler (CDS), the comparator, etc.

The row driver 14 may selectively enable rows of the active pixel sensor array 15.

The active pixel sensor array 15 may sense an external image. The active pixel sensor array 15 may include a plurality of pixels.

The readout circuit 16 may sample a pixel signal provided from the active pixel sensor array 15, compare the sampled pixel signal with the ramp signal and then convert an analog image signal (data) into a data image signal (data) based on the compared result.

The buffer 17 may include, for example, a latch. The buffer 17 may temporarily store the image signal IS that will be provided to the outside, and may transmit the image signal IS to an external memory or an external device.

Figure 2:
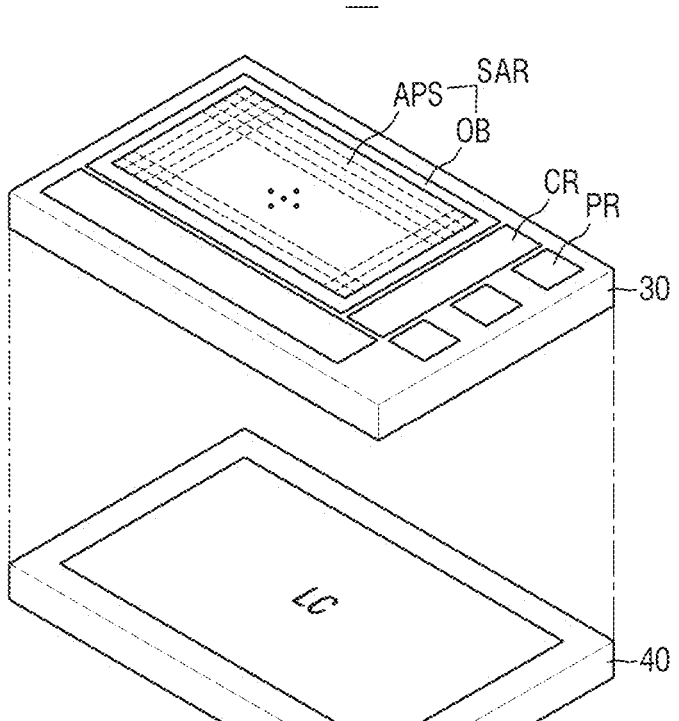
FIG. 2 is a block view illustrating an image sensor according to some example embodiments of the present disclosure.

FIG. 2 is a block view illustrating an image sensor according to some example embodiments of the present disclosure.

Referring to FIG. 2, the image sensor 10 of the present embodiment may include a first chip 30 and a second chip 40, which are stacked. For example, the second chip 40 may be stacked on the first chip 30 in a third direction DR3.

The first chip 30 may include a sensor array region SAR, a connection region CR, and a pad region PR.

The sensor array region SAR may include a region corresponding to the active pixel sensor array 15 of FIG. 1. For example, a plurality of pixels arranged in two dimensions (e.g., in a matrix form) may be disposed in the sensor array region SAR. The sensor array region SAR may include a light receiving region APS and a light blocking region OB. Active pixels may be arranged in the light receiving region APS to generate an active signal by receiving light. Optical black pixels may be arranged in the light blocking region OB to generate an optical black signal by shielding light. For example, although the light blocking region OB may be formed along the periphery of the light receiving region APS, this is only exemplary.

In some example embodiments, a photoelectric conversion element may not be formed inside a portion of the light blocking region OB. Also, in some example embodiments, dummy pixels may be formed in the light receiving region APS adjacent to the light blocking region OB.

The connection region CR may be formed near the sensor array region SAR. Although the connection region CR may be formed on one side of the sensor array region SAR, this is only exemplary. Wirings may be formed in the connection region CR and configured to transmit and receive electrical signals of the sensor array region SAR.

The pad region PR may be formed near the sensor array region SAR. The pad region PR may be formed to be adjacent to the edge of the image sensor according to some example embodiments, but this is only exemplary. The pad region PR may be connected to an external device, and may be configured to transmit and receive an electrical signal between the image sensor and the external device according to some example embodiments.

Although the connection region CR is shown as being interposed between the sensor array region SAR and the pad region PR, this is only exemplary. The arrangement of the sensor array region SAR, the connection region CR and the pad region PR may vary as necessary.

The second chip 40 may be disposed below the first chip 30, and may include a logic circuit region LC. The second chip 40 may be electrically connected to the first chip 30. The logic circuit region LC of the second chip 18 may be electrically connected to the sensor array region SAR through the pad region PR of the first chip 30, for example.

The logic circuit region LC may include a plurality of elements for driving the sensor array region SAR. The logic circuit region LC may include, for example, the control register block 11, the timing generator 12, the ramp signal generator 13, the row driver 14, and the read out circuit 16 of FIG. 1.

Figure 3:
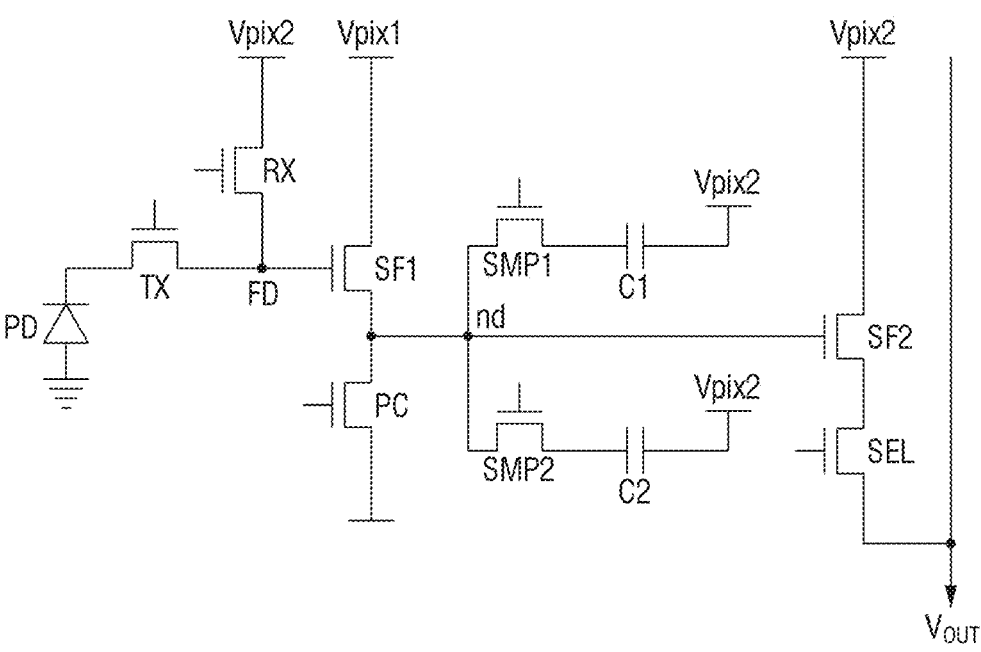
FIG. 3 is an exemplary circuit view illustrating a unit pixel of an image sensor according to some example embodiments of the present disclosure.

FIG. 3 is an exemplary circuit view illustrating a unit pixel of an image sensor according to some example embodiments of the present disclosure.

Referring to FIG. 3, each unit pixel of the image sensor according to some example embodiments may include a photoelectric conversion element PD, a transfer transistor TX, a reset transistor RX, a first source follower transistor SF1, a pre-charge transistor PC, a first sampling transistor SMP1, a second sampling transistor SMP2, a second source follower transistor SF2, a selection transistor SEL, a first capacitor C1, and a second capacitor C2.

The photoelectric conversion element PD may generate and accumulate charges (photo charges) in proportion to the amount of light incident from the outside. The photoelectric conversion element PD may include, but is not limited to, at least one of, for example, a photo diode, a photo transistor, a photo gate, a pinned photodiode (PPD), or their combination.

The transfer transistor TX may be connected between the photoelectric conversion element PD and a floating diffusion region FD. The transfer transistor TX may be controlled by a transmission signal input to a gate electrode (transfer gate electrode). When the transfer transistor TX is turned on, charges accumulated in the photoelectric conversion element PD may be transmitted to the floating diffusion region FD.

The floating diffusion region FD may receive the charges generated by the photoelectric conversion element PD and accumulatively store the charges. A potential of a gate electrode of the first source follower transistor SF1 may vary depending on the amount of the charges accumulated in the floating diffusion region FD.

The reset transistor RX may periodically reset the charges accumulated in the floating diffusion region FD. The reset transistor RX may be controlled by a reset signal input to a gate electrode (reset gate electrode). A source of the reset transistor RX may be connected to the floating diffusion region FD. When the reset transistor RX is turned on by the reset signal, a predetermined (or, alternatively, desired) electrical potential (e.g., second power voltage Vpix2) provided to a drain of the reset transistor RX may be transferred to the floating diffusion region FD. Therefore, when the reset transistor RX is turned on, the photo charges accumulated in the floating diffusion region FD may be discharged, so that the floating diffusion region FD may be reset.

A gate electrode (first source/follower gate electrode) of the first source follower transistor SF1 may be connected to the floating diffusion region FD. The first source follower transistor SF1 may be a source follower buffer amplifier for amplifying a potential change of the floating diffusion region FD to generate a source/drain current. A drain of the first source follower transistor SF1 may be connected to a power voltage (e.g., first power voltage Vpix1), and a source of the first source follower transistor SF1 may be connected to a node nd.

In some example embodiments, the first sampling transistor SMP1 may be connected between the source (or node nd) of the first source follower transistor SF1 and the first capacitor C1. The first capacitor C1 may be connected to the first sampling transistor SMP1. For example, a first electrode of the first capacitor C1 may be connected to the first sampling transistor SMP1, and a predetermined (or, alternatively, desired) electrical potential (e.g., second power voltage Vpix2) may be applied to a second electrode of the first capacitor C1. The first sampling transistor SMP1 may be controlled by a first sampling signal input to the gate electrode (first sampling gate electrode). When the first sampling transistor SMP1 is turned on, the first capacitor C1 may sample an electrical signal of the node nd.

In some example embodiments, the second sampling transistor SMP2 may be connected between the source (or node nd) of the first source follower transistor SF1 and the second capacitor C2. The second capacitor C2 may be connected to the second sampling transistor SMP2. For example, a first electrode of the second capacitor C2 may be connected to the second sampling transistor SMP2, and a predetermined (or, alternatively, desired) electrical potential (e.g., second power voltage Vpix2) may be applied to a second electrode of the second capacitor C2. The second sampling transistor SMP2 may be controlled by a second sampling signal input to the gate electrode (second sampling gate electrode). When the second sampling transistor SMP2 is turned on, the second capacitor C2 may sample the electrical signal of the node nd.

A gate electrode (second source/follower gate electrode) of the second source follower transistor SF2 may be connected to the node nd. The second source follower transistor SF2 may be a source follower buffer amplifier for amplifying a potential change of the node nd to generate a source/drain current. A drain of the second source follower transistor SF2 may be connected to the power voltage (e.g., second power voltage Vpix2), and a source of the second source follower transistor SF2 may be connected to a drain of the selection transistor SEL.

The selection transistor SEL may select a unit pixel to be read in a row unit. The selection transistor SEL may be controlled by a selection signal input to a gate electrode (selection gate). When the selection transistor SEL is turned on, the pixel signal may be output to an output line Vout.

The operation of the unit pixel of the image sensor according to some example embodiments may include a reset step of resetting the photoelectric conversion element PD and the floating diffusion region FD, an optical accumulation step of accumulating photoelectric charges in the photoelectric conversion element PD, and a sampling step of outputting the accumulated photo charges as a pixel signal. The sampling step may include a noise signal sampling step and an image signal sampling step.

In the reset step, the reset transistor RX and the transfer transistor TX may be turned on. Therefore, a power voltage (e.g., second power voltage Vpix2) may be provided to the floating diffusion region FD, and the charges of the photoelectric conversion element PD and the floating diffusion region FD may be discharged and reset.

After the reset step, the transfer transistor TX may be turned off. In the optical accumulation step, the photo charges may be generated and accumulated in the photoelectric conversion element PD until the turned-off transfer transistor TX is turned on again (e.g., during the photoelectric conversion time).

After the optical accumulation step, the floating diffusion region FD may be reset to the power voltage (e.g., second power voltage Vpix2) to provide a noise signal. In this case, the noise signal may include a noise component. The noise signal, which includes the noise component, may be amplified by the first source follower transistor SF1.

In the noise signal sampling step according to some example embodiments, the first sampling transistor SMP1 may be turned on, and the first capacitor C1 may sample the first sampling signal that includes the noise component.

Before the noise signal sampling step, the first capacitor C1 may be precharged to remove the previously sampled voltage, so that the first source follower transistor SF1 may sample a new voltage. This precharging operation may be performed by a precharge transistor PC. In the noise signal sampling step, the second sampling transistor SMP2 may be turned off.

After the noise signal sampling step, the transfer transistor TX may be turned on again. The image signal may be amplified by the first source follower transistor SF1.

In the image signal sampling step according to some example embodiments, the second sampling transistor SMP2 may be turned on, and the second capacitor C2 may sample the image signal.

Before the image signal sampling step, the second capacitor C2 may be precharged by removing the previously sampled voltage, so that the first source follower transistor SF1 may sample a new voltage. This precharging operation may be performed by a precharge transistor PC. In the image signal sampling step, the first sampling transistor SMP1 may be turned off.

Each unit pixel of the image sensor according to some example embodiments may perform a correlated double sampling (CDS) operation. For example, each of the unit pixels may doubly sample the noise signal and the image signal to output a difference level corresponding to a difference between the noise signal and the image signal to the output line Vout. Therefore, the pixel signal from which the noise component is removed may be output to the output line Vout.

Figure 4:
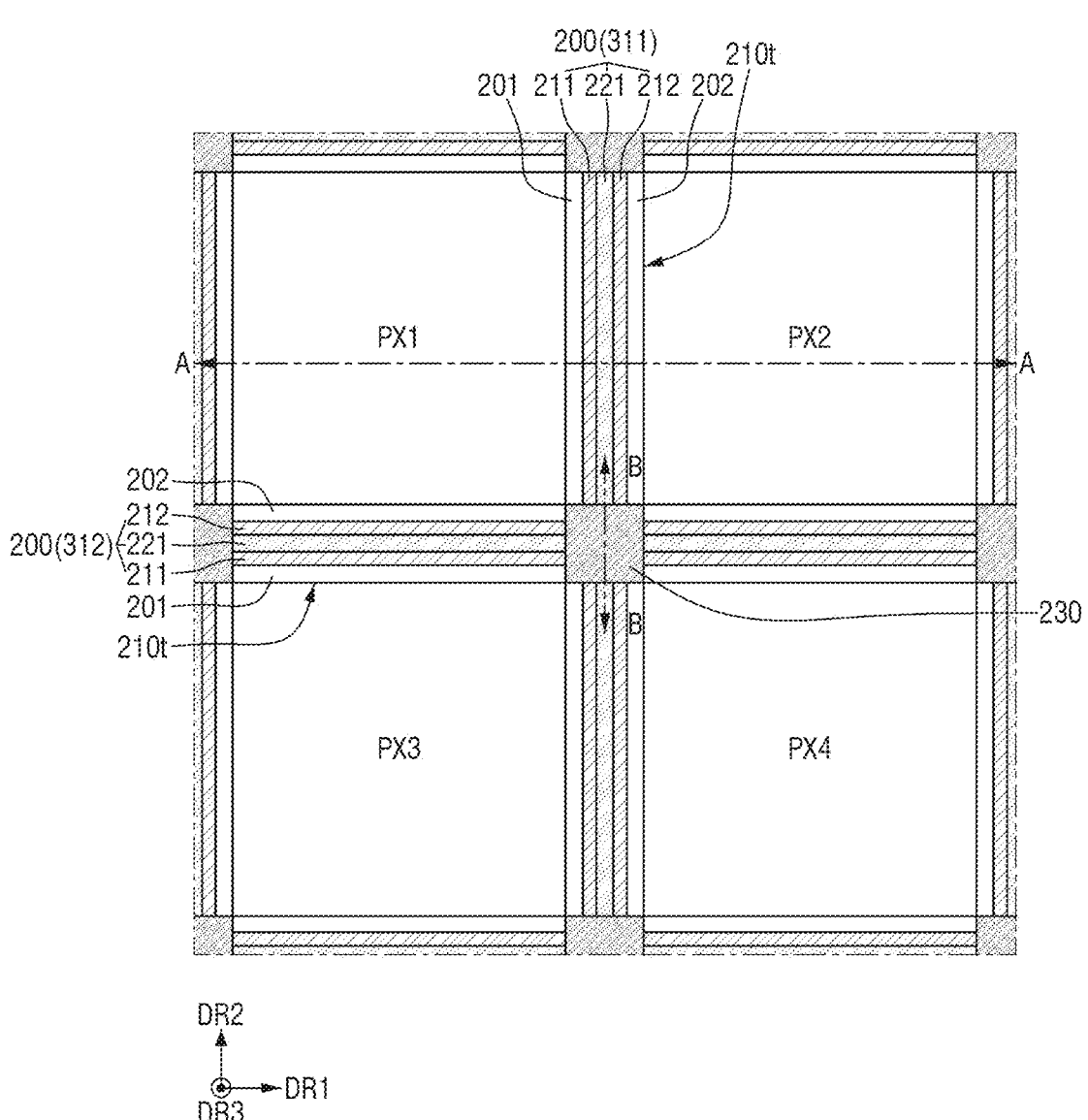
FIG. 4 is a layout view illustrating an image sensor according to some example embodiments of the present disclosure.
Figure 5:
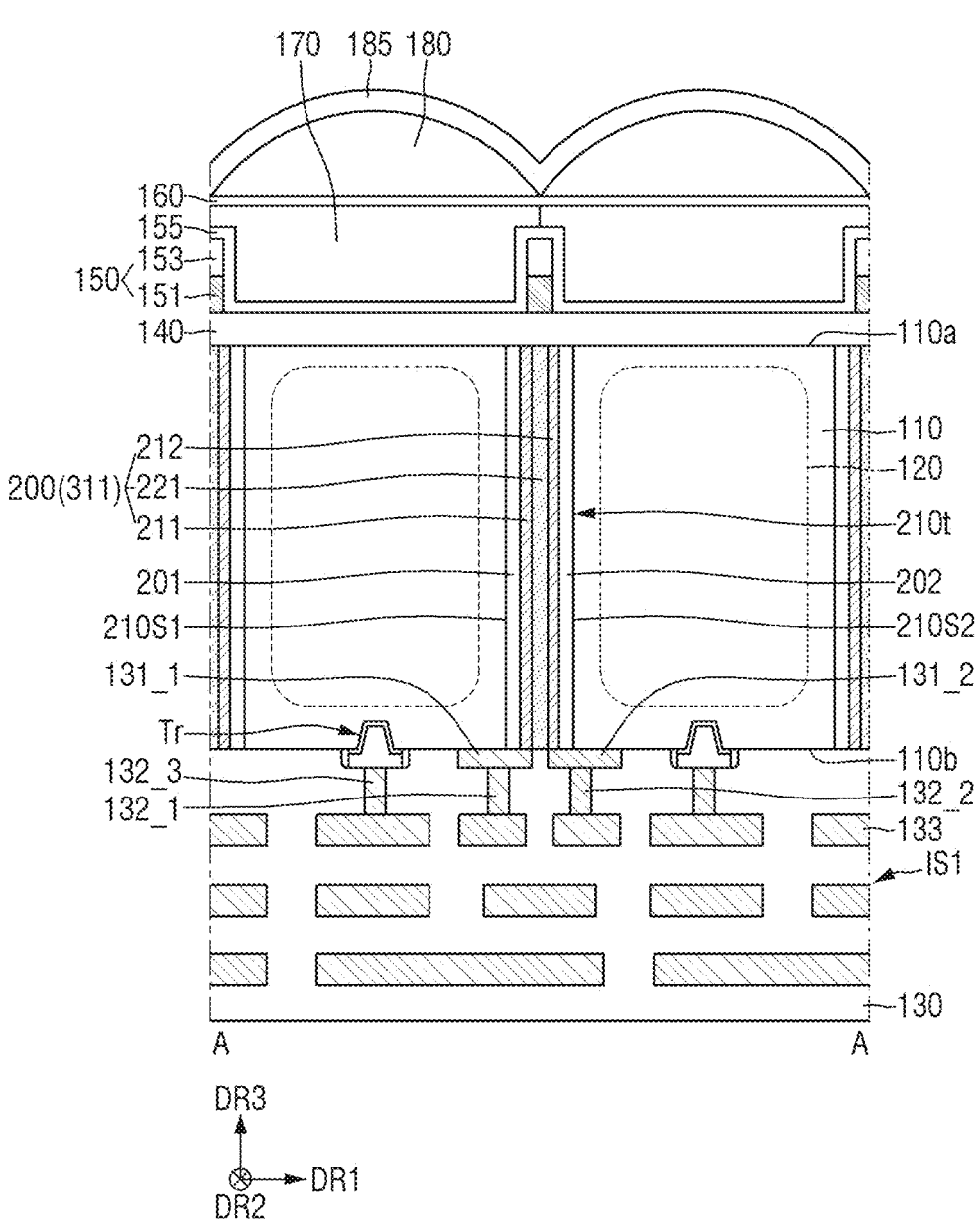
FIG. 5 is a cross-sectional view taken along line A-A of FIG. 4.
Figure 6:
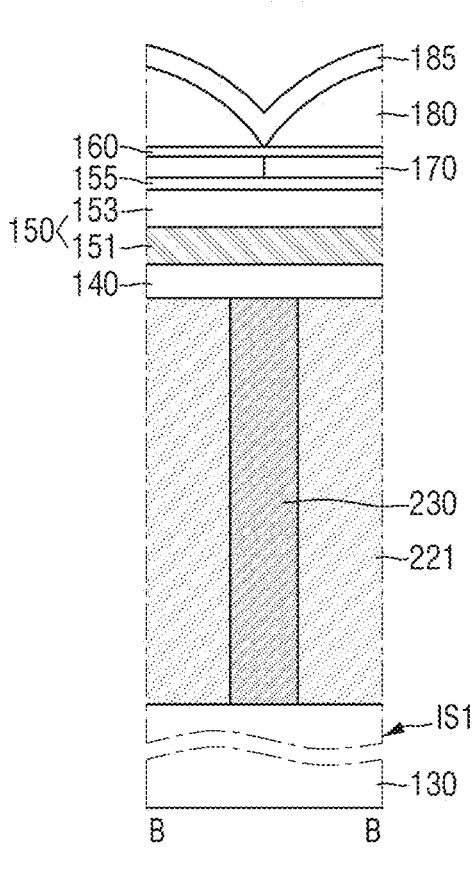
FIG. 6 is a cross-sectional view taken along line B-B of FIG. 4.
Figure 6:
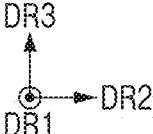

FIG. 4 is a layout view illustrating an image sensor according to some example embodiments of the present disclosure. FIG. 5 is a cross-sectional view taken along line A-A of FIG. 4. FIG. 6 is a cross-sectional view taken along line B-B of FIG. 4.

Referring to FIGS. 4 to 6, the image sensor according to some example embodiments may include a substrate 110, a photoelectric conversion element 120, a wiring structure IS1, a first planarization layer 140, a grid pattern 150, a first passivation layer 155, a second planarization layer 160, a color filter 170, a micro lens 180, a second passivation layer 185, a capacitor structure 200, and a first capacitor isolation pattern 230.

The substrate 110 may be a semiconductor substrate. For example, the substrate 110 may be bulk silicon or silicon-on-insulator (SOI). The substrate 110 may be a silicon substrate, or may include other materials such as silicon germanium, indium antimonide, lead telluride compound, indium arsenide, indium phosphide, gallium arsenide and/or gallium antimonide. Alternatively, the substrate 110 may be formed of an epitaxial layer on the base substrate.

The substrate 110 may include a first surface 110a and a second surface 110b, which are opposite to each other. In some of the example embodiments described below, the first surface 110a may be referred to as a back side of the substrate 110, and the second surface 110b may be referred to as a front side of the substrate 110. In some example embodiments, the first surface 110a of the substrate 110 may be a photo receiving surface upon which light is incident. That is, the image sensor according to some example embodiments may be a back side illuminated (BSI) image sensor.

In some example embodiments, a wiring 133 may be electrically connected to the unit pixels PX1 to PX4. For example, the wiring 133 may be connected to a transistor Tr.

The plurality of unit pixels PX1 to PX4 may be formed in the substrate 110. Each of the unit pixels PX1 to PX4 may have a polygonal shape on a plane. In the image sensor according to some example embodiments, the plurality of unit pixels PX1 to PX4 may be arranged in two dimensions (e.g., in a matrix form) on a plane that includes a first direction DR1 and a second direction DR2, as shown in FIG. 4, and may have a rectangular shape.

Each of the unit pixels PX1 to PX4 may include a photoelectric conversion element 120. The photoelectric conversion element 120 may be formed in the substrate 110. The photoelectric conversion element 120 may generate charges in proportion to the amount of light incident from the outside.

The photoelectric conversion element 120 may be formed by doping impurities in the substrate 110. For example, the photoelectric conversion element 120 may be formed by ion-implantation of n-type impurities into the p-type substrate 110. In some example embodiments, the photoelectric conversion element 120 may have a potential slope in a vertical direction (e.g., direction crossing the first surface 110a and the second surface 110b of the substrate 110) perpendicular to an upper surface of the substrate 110. For example, the photoelectric conversion element 120 may be a stacked form of a plurality of impurity regions. The photoelectric conversion element 120 may be the photoelectric conversion element PD of FIG. 3.

Each of the unit pixels PX1 to PX4 may include a transistor Tr. In some example embodiments, the transistor Tr may be formed on the second surface 110b of the substrate 110. The transistor Tr may be connected to the photoelectric conversion element 120 to constitute various transistors for processing an electrical signal. For example, the transistor Tr may constitute transistors such as the transfer transistor TX, the reset transistor RX, the source follower transistors SF1 and SF2 or the selection transistor SEL of FIG. 3.

In some example embodiments, the transistor Tr may include a vertical transfer transistor. For example, a portion of the transistor Tr constituting the transfer transistor TX may be extended into the substrate 110. The transfer transistor TG may reduce an area of the unit pixel, thereby enabling high integration of the image sensor.

A first trench 210t may be formed in the substrate 110. The first trench 210t may be extended in the first direction DR1 and the second direction DR2 in the substrate 110. The first trench 210t may be formed to surround each of the unit pixels PX1 to PX4 in view of a plan. In view of a plan, the first trench 210t may be formed in a lattice shape in the substrate 110 to separate the plurality of unit pixels PX1 to PX4.

The first trench 210t may be extended from the second surface 110b to the first surface 110a of the substrate 110. The first trench 210t may be, for example, a deep trench formed by patterning the substrate 110.

The first trench 210t may include a first sidewall 210S1 and a second sidewall 210S2, which are opposite to each other in the substrate 110. The first sidewall 210S1 and the second sidewall 210S2 may be opposite to each other in a direction in which the first trench 210t is extended.

A first insulating layer 201 may be extended along the first sidewall 210S1 of the first trench 210t. A second insulating layer 202 may be extended along the second sidewall 210S2 of the first trench 210t. The first insulating layer 201 and the second insulating layer 202 may include, but are not limited to, at least one of, for example, silicon nitride, silicon oxynitride, or silicon oxide.

The capacitor structure 200 may be formed in the first trench 210t. The capacitor structure 200 may fill the first trench 210t between the first insulating layer 201 and the second insulating layer 202.

The capacitor structure 200 may be extended along the extended direction of the first trench 210t. The capacitor structure 200 may include a first electrode 211 formed on the first sidewall 210S1 of the first trench 210t, a second electrode 212 formed on the second sidewall 210S2 of the first trench 210t, and a first dielectric layer 221 between the first electrode 211 and the second electrode 212. The first electrode 211 may be extended along the first sidewall 210S1, and the second electrode 212 may be extended along the second sidewall 210S2. The first electrode 211 may be disposed between the first insulating layer 201 and the first dielectric layer 221, and the second electrode 212 may be disposed between the first dielectric layer 221 and the second insulating layer 202.

Each of the first electrode 211 and the second electrode 212 may include, but is not limited to, at least one of a high melting point metal layer such as cobalt, titanium, nickel, tungsten and molybdenum, and/or a metal nitride layer such as a titanium nitride layer (TiN), a titanium silicon nitride layer (TiSiN), a titanium aluminum nitride layer (TiAlN), a tantalum nitride layer (TaN), a tantalum silicon nitride layer (TaSiN), a tantalum aluminum nitride layer (TaAlN) and a tungsten nitride layer (WN), or their combination.

The first dielectric layer 221 may include, but is not limited to, at least one of a metal oxide such as $HfO_2$, $ZrO_2$, $Al_2O_3$, $La_2O_3$, $Ta_2O_3$ and $TiO_2$, a dielectric material having a perovskite structure such as $SrTiO_3$(STO), $(Ba,Sr)TiO_3$ (BST), $BaTiO_3$, PZT and PLZT, or their combination. The first dielectric layer 221 may be a single layer or a multi-layer.

The first capacitor isolation pattern 230 may be formed in the substrate 110. The first capacitor isolation pattern 230 may be disposed at an intersection point of the first trench 210t in view of a plane. In the image sensor according to some example embodiments, the first capacitor isolation pattern 230 may be disposed to correspond to a lattice point of the first trench 210t. Therefore, the capacitor structure 200 may be disposed on a side of each of the unit pixels PX1 to PX4. The capacitor structure 200 may be divided into a first capacitor structure 311 and a second capacitor structure 321 by the first capacitor isolation pattern 230.

Each of the unit pixels PX1 to PX4 may include a first capacitor structure 311 and a second capacitor structure 321. The first capacitor structure 311 may be disposed on a right side of each of the unit pixels PX1 to PX4 in the first direction DR1, and the second capacitor structure 321 may be disposed on a lower surface of each of the unit pixels PX1 to PX4 in the second direction DR2. The first capacitor structure 311 may extend in the second direction D2, and the second capacitor structure 312 may extend in the first direction D1.

That is, the first capacitor isolation pattern 230 may isolate the first capacitor structure 311 of the first unit pixel PX1 from the first capacitor structure 311 of the third unit pixel PX3, and may isolate the second capacitor structure 321 of the first unit pixel PX1 from the second capacitor structure 321 of the second unit pixel PX2. The first capacitor isolation pattern 230 may fill spaces among the first capacitor structure 311 of the first unit pixel PX1, the first capacitor structure 311 of the third unit pixel PX3, the second capacitor structure 321 of the first unit pixel PX1, and the second capacitor structure 321 of the second unit pixel PX2 in the first trench 210t.

For example, the first capacitor structure 311 may correspond to the first capacitor C1 of FIG. 3, and the second capacitor structure 321 may correspond to the second capacitor C2 of FIG. 3. For another example, the first capacitor structure 311 may correspond to the second capacitor C2 of FIG. 3, and the second capacitor structure 321 may correspond to the first capacitor C1 of FIG. 3.

In the image sensor according to some example embodiments, the first capacitor isolation pattern 230 may fill the first trench 210t between the first capacitor structure 311 and the second capacitor structure 321. That is, the first capacitor isolation pattern 230 may be formed by filling the lattice point of the first trench 210t. The first capacitor isolation pattern 230 may include, for example, a material different from that of the substrate 110. The first capacitor isolation pattern 230 may include an insulating material.

The wiring structure IS1 may be formed on the substrate 110. In some example embodiments, the wiring structure IS1 may be formed on the second surface 110b of the substrate 110.

The wiring structure IS1 may be comprised of one or a plurality of wirings. For example, the wiring structure IS1 may include an interconnection insulating layer 130, a first pad 131_1, a second pad 131_2, a first contact 132_1, a second contact 132_2, a third contact 132_3, and a wiring 133 in the interconnection insulating layer 130. In FIG. 5, the number of wiring layers constituting the wiring structure IS1 and the arrangement thereof are only exemplary, and a connection via electrically connecting the wiring layers is formed between the wiring layers.

The first pad 131_1 and the second pad 131_2 may be formed on the second surface 110b of the substrate 110. The first pad 131_1 and the second pad 131_2 may be electrically connected to the capacitor structure 200. The first pad 131_1 may be electrically connected to the first pad 131_1, and the second pad 131_2 may be electrically connected to the second pad 131_2.

The first contact 132_1 may be electrically connected to the first pad 131_1. The second contact 132_2 may be electrically connected to the second pad 131_2. The first electrode 211 may receive a voltage through the first contact 132_1 and the first pad 131_1, and the second electrode 212 may receive a voltage through the second contact 132_2 and the second pad 131_2.

In the image sensor according to some example embodiments, the first electrode 211 and the second electrode 212 may be provided with a negative voltage during an effective integration time that accumulates photo charges in the photoelectric conversion element PD. Therefore, the first electrode 211 and the second electrode 212 may reduce a dark current during the effective accumulation time. In addition, the first electrode 211 and the second electrode 212 may allow light incident upon a unit pixel to totally reflect light incident upon another adjacent unit pixel, whereby crosstalk may be deteriorated.

In addition to the effective accumulation time, any one of the first electrode 211 and the second electrode 212 may be provided with a second power voltage (Vpix2 of FIG. 2).

That is, a voltage applied to the first electrode 211 and the second electrode 212 may be selectively provided, and therefore, the capacitor structure 200 may serve as a capacitor, and may also serve as a total reflection plate for preventing or reducing crosstalk.

The wiring 133 may be electrically connected to the transistor Tr through the first contact 132_3. For example, the first contact 132_3 may connect the wiring 133 with a gate electrode or a source/drain region of the transistor Tr by passing through the interconnection insulating layer 130.

The first planarization layer 140 may be formed on the first surface 110a of the substrate 110. The first planarization layer 140 may cover the first surface 110a of the substrate 110.

The first planarization layer 140 may include an insulating material. For example, the first planarization layer 140 may include at least one of silicon oxide, silicon nitride, silicon oxynitride, aluminum oxide, hafnium oxide, or their combination.

Also, in some example embodiments, the first planarization layer 140 may be formed of a multi-layer. For example, the first planarization layer 140 may include, but is not limited to, an aluminum oxide layer, a hafnium oxide layer, a silicon oxide layer, a silicon nitride layer, and a hafnium oxide layer, which are sequentially stacked on the first surface 110a of the substrate 110.

The first planarization layer 140 serves as an anti-reflective layer to prevent or reduce reflection of light incident upon the substrate 110, thereby improving a light receiving rate of the photoelectric conversion element 120. In addition, the first planarization layer 140 may serve as a planarization layer to form the color filter 170 and the micro lens 180, which will be described later, at a uniform height.

The color filter 170 may be formed on the first planarization layer 140. The color filter 170 may be arranged to correspond to the respective unit pixels PX1 to PX4. For example, the plurality of color filters 170 may be arranged in two dimensions (e.g., in a matrix form) on a plane that includes a first direction X and a second direction Y.

The color filter 170 may have various color filters depending on the unit pixels PX1 to PX4. For example, the color filter 170 may be arranged in a bayer pattern that includes a red color filter, a green color filter, and a blue color filter, but this is only exemplary. The color filter 170 may include a yellow filter, a magenta filter, and a cyan filter, and may further include a white filter.

In some example embodiments, a grid pattern 150 may be formed between the color filters 170. The grid pattern 150 may be formed on the first planarization layer 140. The grid pattern 150 may be formed in a lattice shape in view of a plane, and may be interposed between the color filters 170. In some example embodiments, the grid pattern 150 may be disposed to overlap the capacitor structure 200 in a vertical direction perpendicular to the upper surface of the substrate 110.

In some example embodiments, the grid pattern 150 may include a conductive pattern 151 and a low refractive index pattern 153. For example, the conductive pattern 151 and the low refractive index pattern 153 may be sequentially stacked on the first planarization layer 140.

The conductive pattern 151 may include a conductive material. For example, the conductive pattern 151 may include at least one of titanium (Ti), titanium nitride (TiN), tantalum (Ta), tantalum nitride (TaN), tungsten (W), aluminum (Al), copper (Cu), or their combination, but is not limited thereto. The conductive pattern 151 may prevent or reduce charges generated by ESD, etc. from being accumulated on the surface (e.g., first surface 110a) of the substrate 110, thereby effectively avoiding an ESD bruise defect.

The low refractive index pattern 153 may include a low refractive index material having a refractive index lower than that of silicon (Si). For example, the low refractive index pattern 153 may include at least one of silicon oxide, aluminum oxide, tantalum oxide, or their combination, but is not limited thereto. The low refractive index pattern 153 may improve condensing efficiency by refracting or reflecting light that is obliquely incident, thereby improving quality of the image sensor.

In some example embodiments, the first passivation layer 155 may be formed on the first planarization layer 140 and the grid pattern 150. For example, the first passivation layer 155 may be extended to be conformal along an upper surface of the first planarization layer 140, and a profile of a side and an upper surface of the grid pattern 150.

The first passivation layer 155 may include, for example, aluminum oxide, but is not limited thereto. The first passivation layer 155 may prevent or reduce the first planarization layer 140 and the grid pattern 150 from being damaged.

The second planarization layer 160 may be formed on the color filter 170. The second planarization layer 160 may cover the color filter 124. The second planarization layer 160 may include an insulating material. For example, the second planarization layer 160 may include silicon oxide, but is not limited thereto.

The micro lens 180 may be formed on the second planarization layer 160. The micro lens 180 may be arranged to correspond to the respective unit pixels PX1 to PX4. For example, the plurality of micro lenses 180 may be arranged in two dimensions (e.g., in a matrix form) on a plane that includes a first direction DR1 and a second direction DR2.

The micro lens 180 may have a convex shape, and may have a predetermined (or, alternatively, desired) radius of curvature. Therefore, the micro lens 180 may condense the light incident upon the photoelectric conversion element 120. The micro lens 180 may include, but is not limited to, a light-transmissive resin.

In some example embodiments, the second passivation layer 185 may be formed on the micro lens 180. The second passivation layer 185 may be extended along a surface of the micro lens 180. For example, the second passivation layer 185 may include an inorganic oxide layer. For example, the second passivation layer 185 may include at least one of silicon oxide, titanium oxide, zirconium oxide, hafnium oxide, or their combination. In some example embodiments, the second passivation layer 185 may include a low temperature oxide (LTO).

The second passivation layer 185 may protect the micro lens 180 from the outside. For example, the second passivation layer 185 may include an inorganic oxide layer to protect the micro lens 180 that includes an organic material. In addition, the second passivation layer 185 may improve quality of the image sensor by improving condensing efficiency of the micro lens 180. For example, the second passivation layer 185 may fill a space between the micro lenses 180, thereby reducing reflection, refraction, and scattering of incident light that reaches the space between the micro lenses 180.

As the image sensor becomes highly integrated, sizes of the unit pixels become smaller and capacitance of the capacitor disposed in the unit pixel is also reduced.

However, in the image sensor according to some example embodiments, the capacitor structure 200 may be disposed in the first trench 210t that is a deep trench in the substrate 110. Therefore, an area of the capacitor structure 200 may be more increased than the case that the capacitor is formed on the second surface 110b of the first substrate 100, whereby capacitance of the capacitor structure 200 may be increased.

Figure 7:
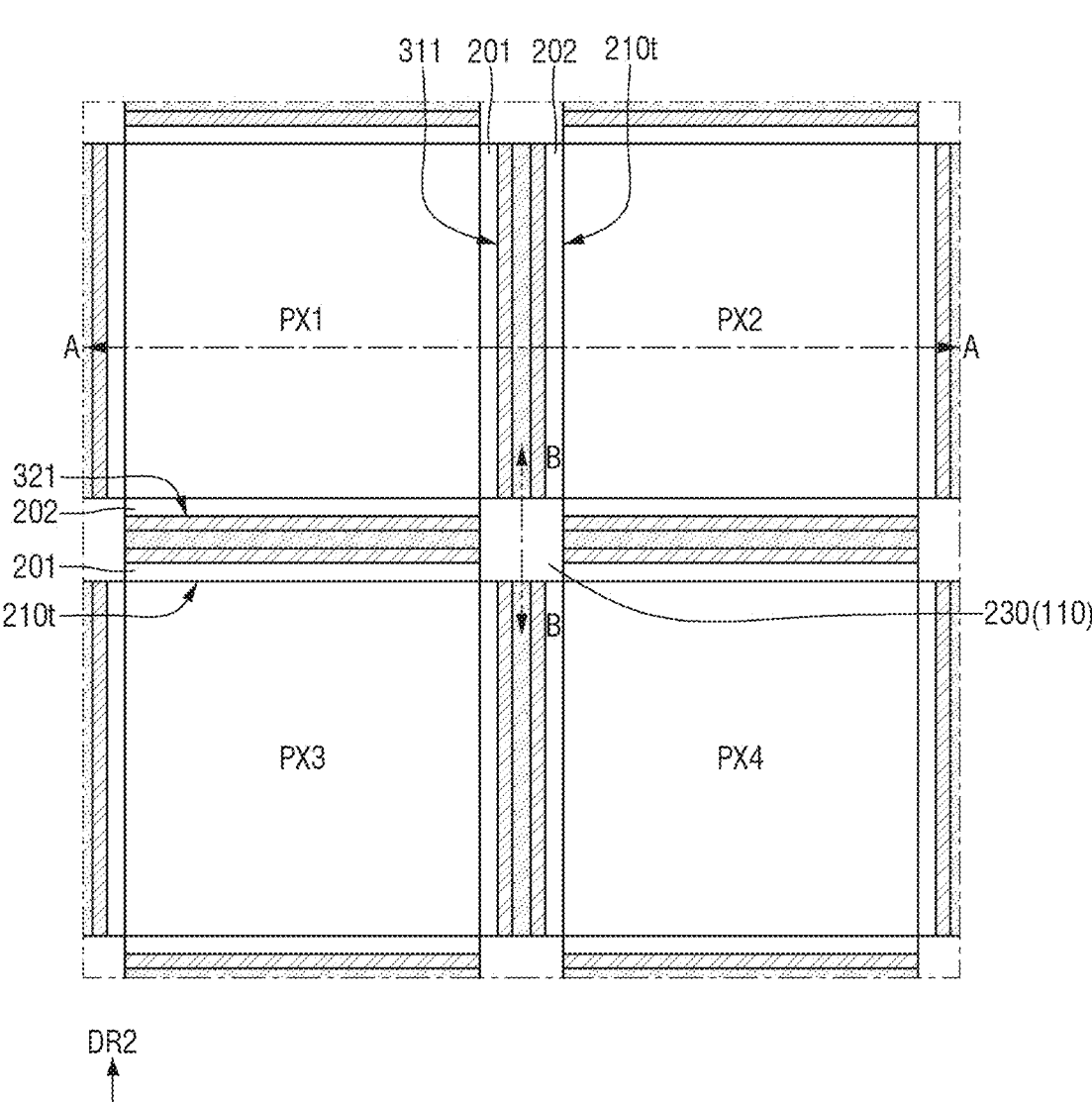
FIG. 7 is a layout view of an image sensor according to some example embodiments of the present disclosure.

FIG. 7 is a layout view of an image sensor according to some example embodiments of the present disclosure. FIG.

8 is a cross-sectional view taken along line B-B of FIG. 7. For convenience of description, portions duplicated with those described with reference to FIGS. 1 to 6 will be described briefly or omitted. For reference, a cross-sectional view taken along line A-A of FIG. 7 may correspond to FIG. 5.

Figure 8:
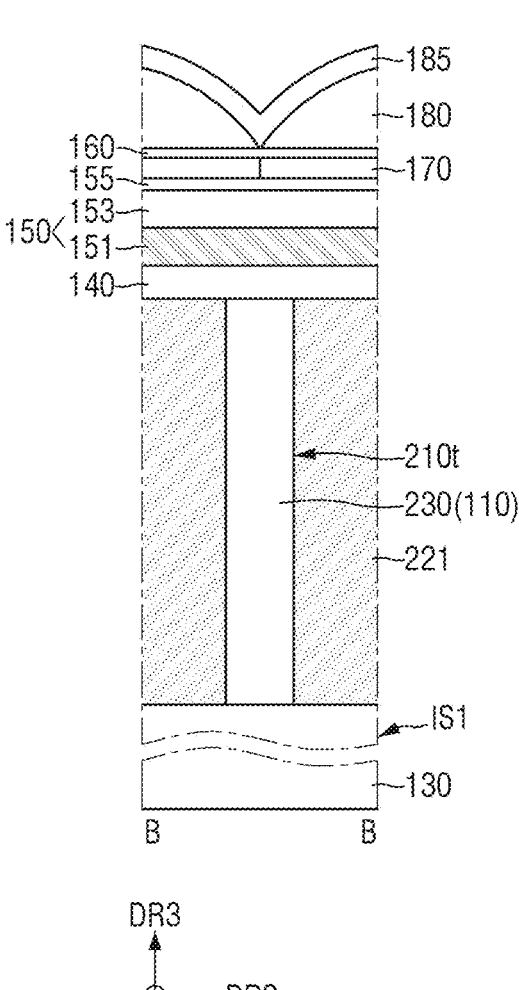
FIG. 8 is a cross-sectional view taken along line B-B of FIG. 7.

Referring to FIGS. 7 and 8, in the image sensor according to some example embodiments, the first pixel isolation pattern 210 may include the same material as that of the substrate 110. The first trench 210*t* may be formed between the first capacitor isolation patterns 210. Sides of the first capacitor isolation pattern 210 may be exposed by the first trench 210*t*. That is, the first trench 210*t* may be formed by etching the substrate 110 in a lattice shape in view of a plan except for the first capacitor isolation pattern 210.

Figure 9:
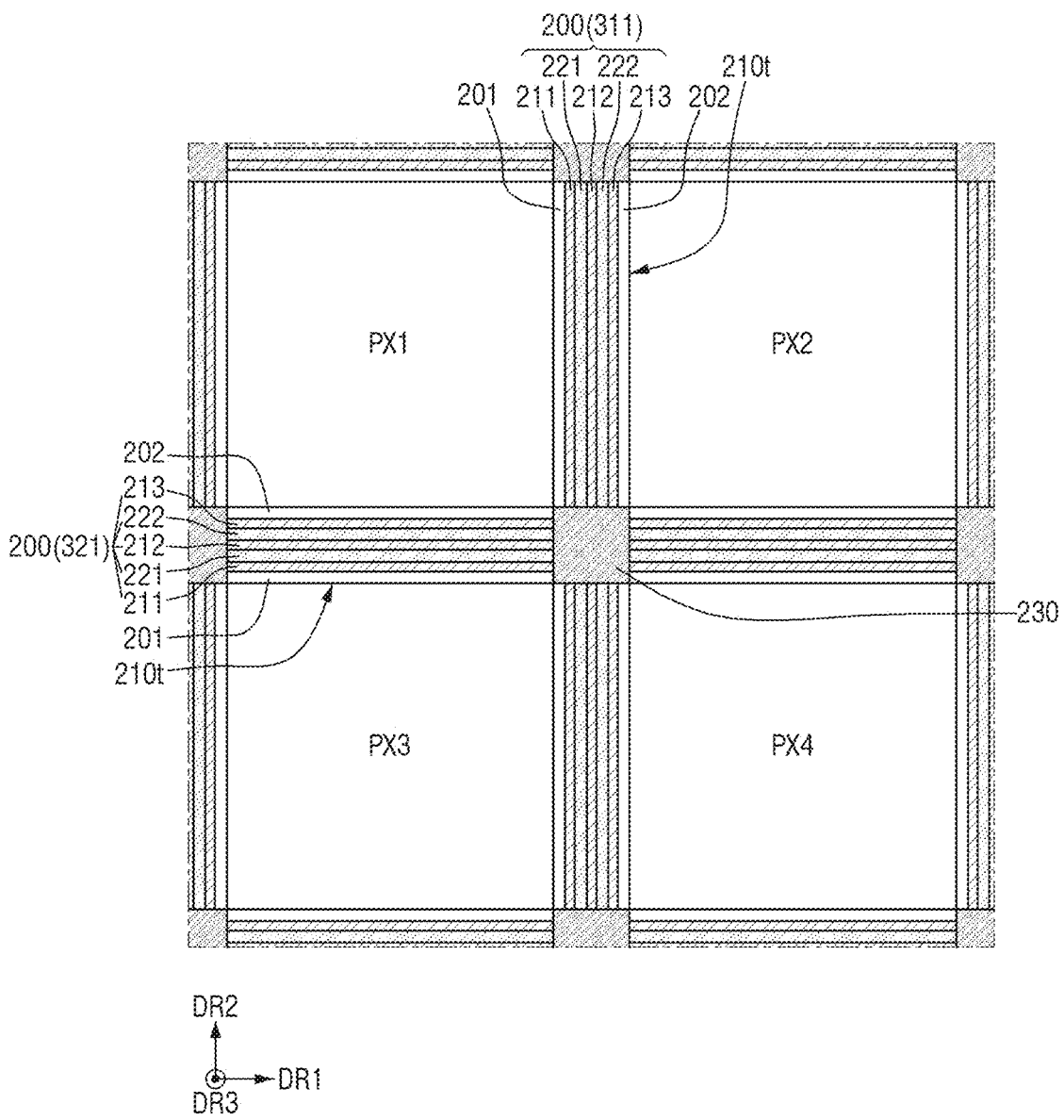
FIGS. 9 and 10 are layout views illustrating an image sensor according to some example embodiments of the present disclosure.
Figure 10:
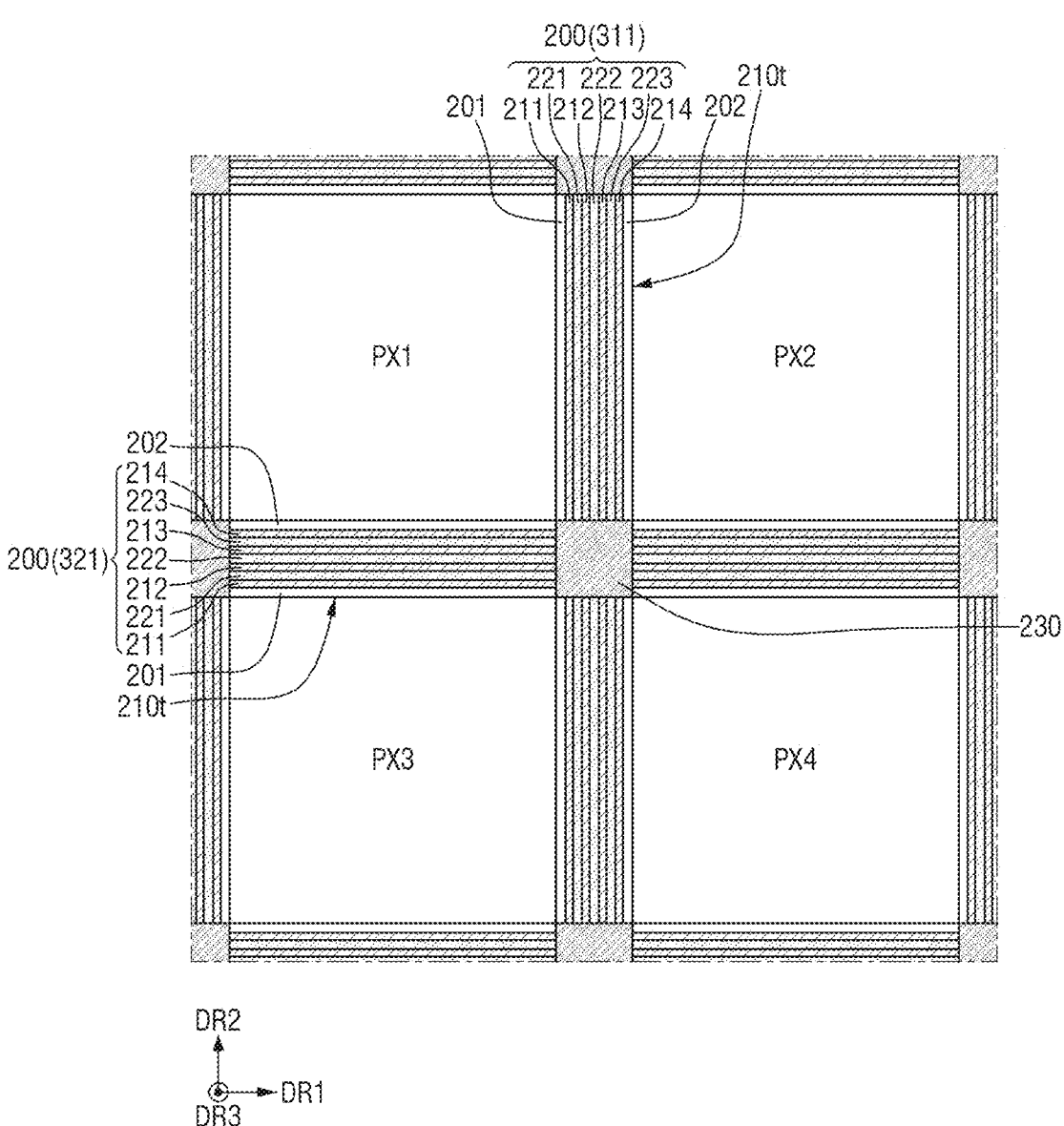

FIGS. 9 and 10 are layout views illustrating an image sensor according to some example embodiments of the present disclosure. For convenience of description, portions duplicated with those described with reference to FIGS. 1 to 6 will be described briefly or omitted.

Referring to FIG. 9, in the image sensor according to some example embodiments, the capacitor structure 200 may include three or more electrodes. Therefore, capacitance of the capacitor structure 200 may be increased.

For example, the capacitor structure 200 may include three electrodes 211, 212 and 213. The capacitor structure 200 may include a first electrode 211, a first dielectric layer 221, a second electrode 212, a second dielectric layer 222, and a third electrode 213. The first electrode 211, the first dielectric layer 221, the second electrode 212, the second dielectric layer 222, and the third electrode 213 may be extended along the extended direction of the first trench 210*t*. The first electrode 211 may be disposed between first insulating layer 201 and the first dielectric layer 221, the second electrode 212 may be disposed between the first dielectric layer 221 and the second dielectric layer 222, and the third electrode 213 may be disposed between the second dielectric layer 222 and the second insulating layer 202.

Referring to FIG. 10, in the image sensor according to some example embodiments, the capacitor structure 200 may include four electrodes 211, 212, 213 and 214. The capacitor structure 200 may include a first electrode 211, a first dielectric layer 221, a second electrode 212, a second dielectric layer 222, a third electrode 213, a third dielectric layer 223, and a fourth electrode 214. The first electrode 211 may be disposed between the first insulating layer 201 and the first dielectric layer 221, the second electrode 212 may be disposed between the first dielectric layer 221 and the second dielectric layer 222, the third electrode 213 may be disposed between the second dielectric layer 222 and the third dielectric layer 223, and the fourth electrode 214 may be disposed between the third dielectric layer 223 and the second insulating layer 202.

Figure 11:
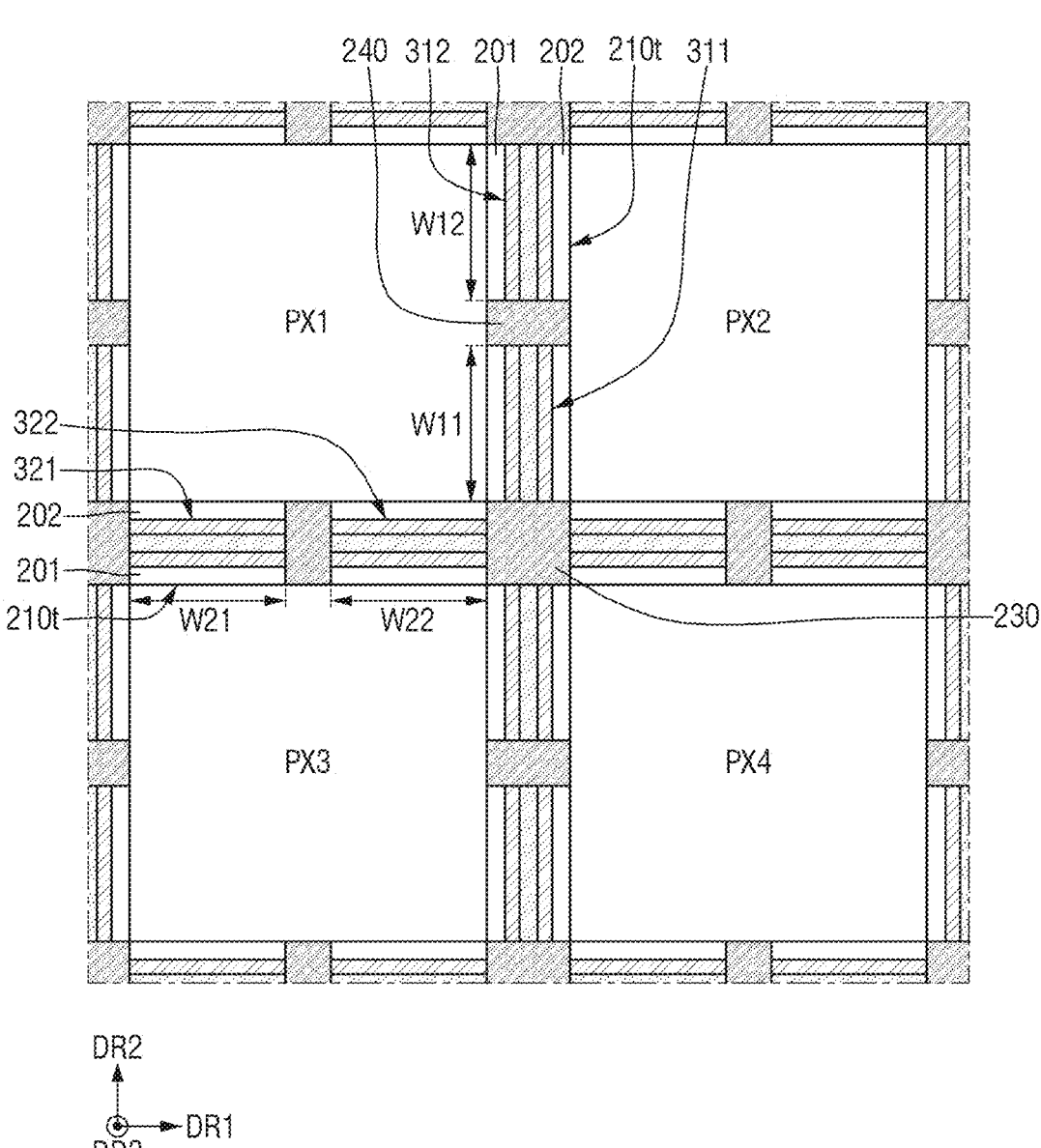
FIG. 11 is a layout view illustrating an image sensor according to some example embodiments of the present disclosure.

FIG. 11 is a layout view illustrating an image sensor according to some example embodiments of the present disclosure. For convenience of description, portions duplicated with those described with reference to FIGS. 1 to 6 will be described briefly or omitted.

Referring to FIG. 11, the image sensor according to some example embodiments may further include a second capacitor isolation pattern 240. The second capacitor isolation pattern 240 may be formed in the first substrate. The second capacitor isolation pattern 240 may be disposed between first capacitor isolation patterns 230 adjacent to each other.

For example, the second capacitor isolation pattern 240 may be disposed between the first capacitor isolation patterns 230 adjacent to each other in the first direction DR1 and between the first capacitor isolation patterns 230 adjacent to each other in the second direction DR2. Therefore, the capacitor structure 200 may include a first capacitor structure 311, a second capacitor structure 321, a third capacitor structure 312, and a fourth capacitor structure 322. The first capacitor structure 311 and the third capacitor structure 312 and the second capacitor structure 321 and the fourth capacitor structure 322 may be isolated by the second capacitor isolation pattern 240.

Each of the unit pixels PX1 to PX4 may include more capacitor structures than those described in FIG. 4. Each of the unit pixels PX1 to PX4 may include a first capacitor structure 311, a second capacitor structure 321, a third capacitor structure 312, and a fourth capacitor structure 322. The first capacitor structure 311 and the third capacitor structure 312 may be disposed on the right side of each of the unit pixels PX1 to PX4 in the first direction DR1, and the second capacitor structure 321 and the fourth capacitor structure 322 may be disposed on a lower surface of each of the unit pixels PX1 to PX4 in the second direction DR2.

For example, a distance W11 between the second capacitor isolation pattern 240, which isolates the first capacitor structure 311 from the third capacitor structure 312, and the first capacitor isolation pattern 230 adjacent to one side of the second capacitor isolation pattern 240 may be substantially the same as a distance W12 between the second capacitor isolation pattern 240 and the first capacitor isolation patterns 230 adjacent to the other side of the second capacitor isolation pattern 240. Therefore, capacitance of the first capacitor structure 311 may be substantially the same as that of the third capacitor structure 312.

A distance W21 between the second capacitor isolation pattern 240, which isolates the second capacitor structure 312 from the fourth capacitor structure 322, and the first capacitor isolation pattern 230 adjacent to one side of the second capacitor isolation pattern 240 may be substantially the same as a distance W22 between the second capacitor isolation pattern 240 and the first capacitor isolation pattern 230 adjacent to the other side of the second capacitor isolation pattern 240. Therefore, capacitance of the second capacitor structure 312 may be substantially the same as that of the fourth capacitor structure 322.

Figure 12:
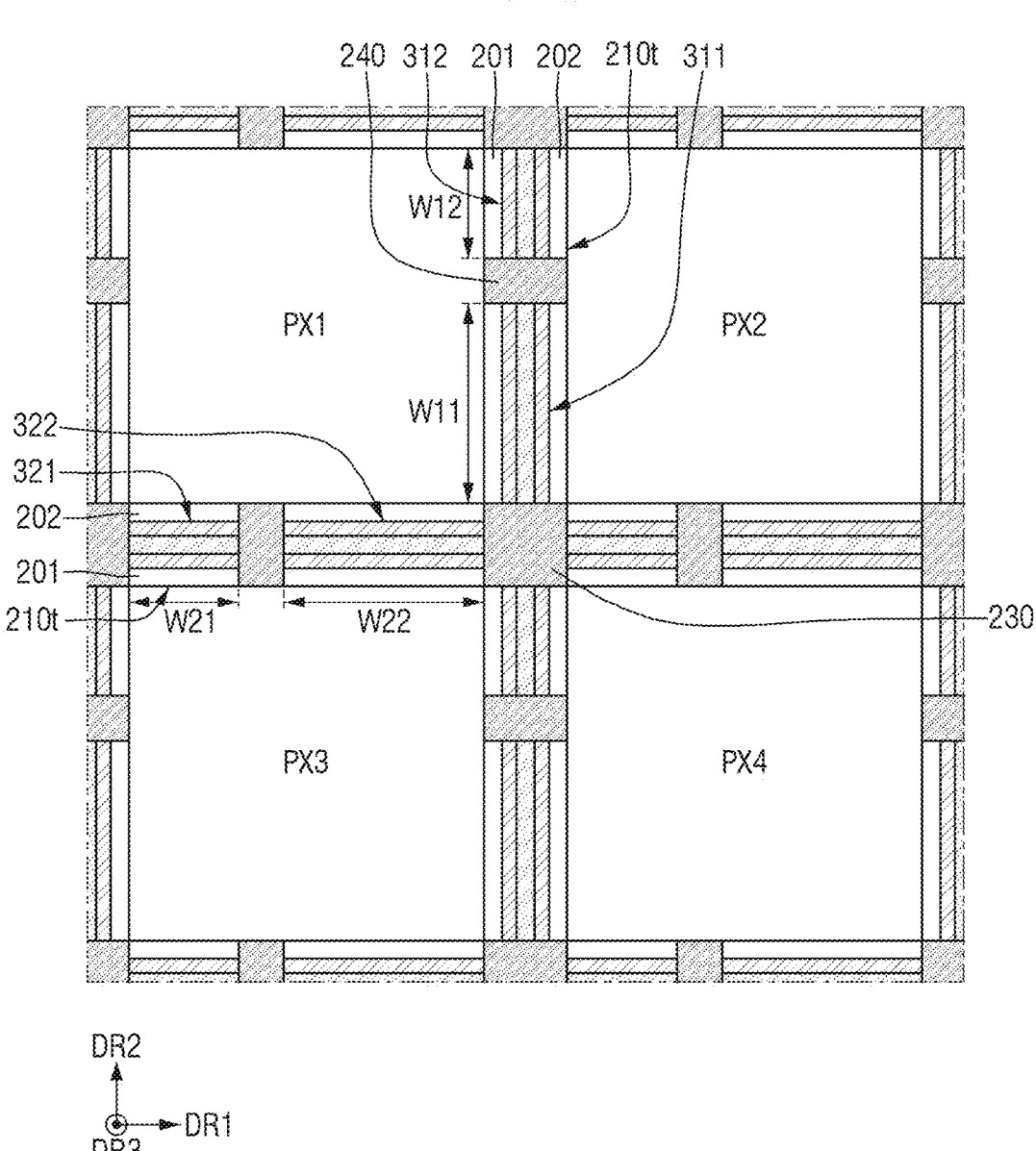
FIG. 12 is a layout view illustrating an image sensor according to some example embodiments of the present disclosure.

FIG. 12 is a layout view illustrating an image sensor according to some example embodiments of the present disclosure. For convenience of description, portions duplicated with those described with reference to FIG. 11 will be described briefly or omitted.

Referring to FIG. 12, in the image sensor according to some example embodiments, a distance W11 between the second capacitor isolation pattern 240, which isolates the first capacitor structure 311 from the third capacitor structure 312, and the first capacitor isolation pattern 230 adjacent to one side of the second capacitor isolation pattern 240 may be substantially the same as a distance W12 between the second capacitor isolation pattern 240 and the first capacitor isolation pattern 230 adjacent to the other side of the second capacitor isolation pattern 240. Therefore, capacitance of the first capacitor structure 311 may be substantially the same as that of the third capacitor structure 312.

A distance W21 between the second capacitor isolation pattern 240, which isolates the second capacitor structure 312 from the fourth capacitor structure 322, and the first capacitor isolation pattern 230 adjacent to one side of the second capacitor isolation pattern 240 may be substantially the same as a distance W22 between the second capacitor isolation pattern 240 and the first capacitor isolation pattern 230 adjacent to the other side of the second capacitor isolation pattern 240. Therefore, capacitance of the second capacitor structure 312 may be substantially the same as that of the fourth capacitor structure 322.

Figure 13:
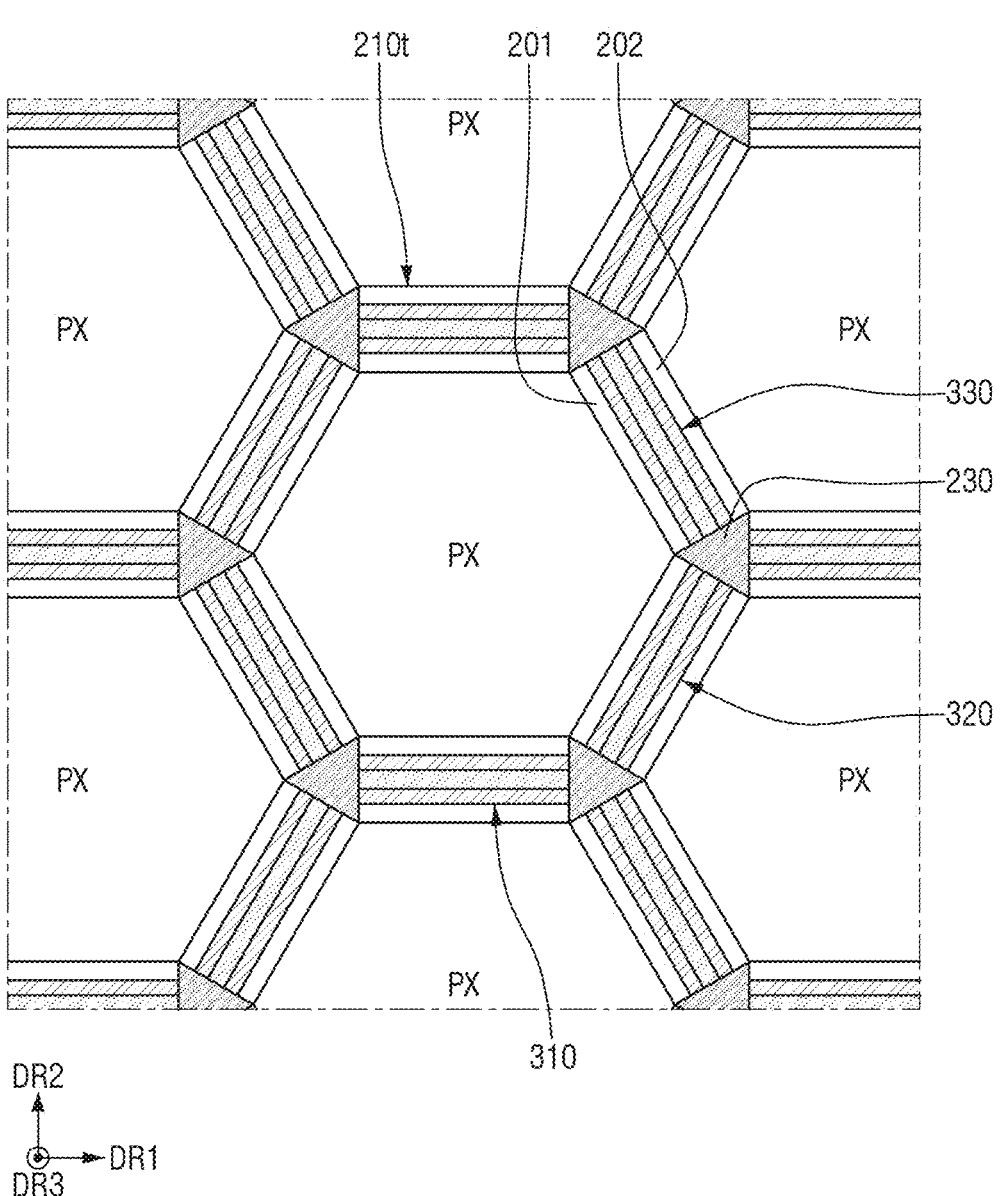
FIGS. 13 and 14 are layout views illustrating an image sensor according to some example embodiments of the present disclosure.
Figure 14:
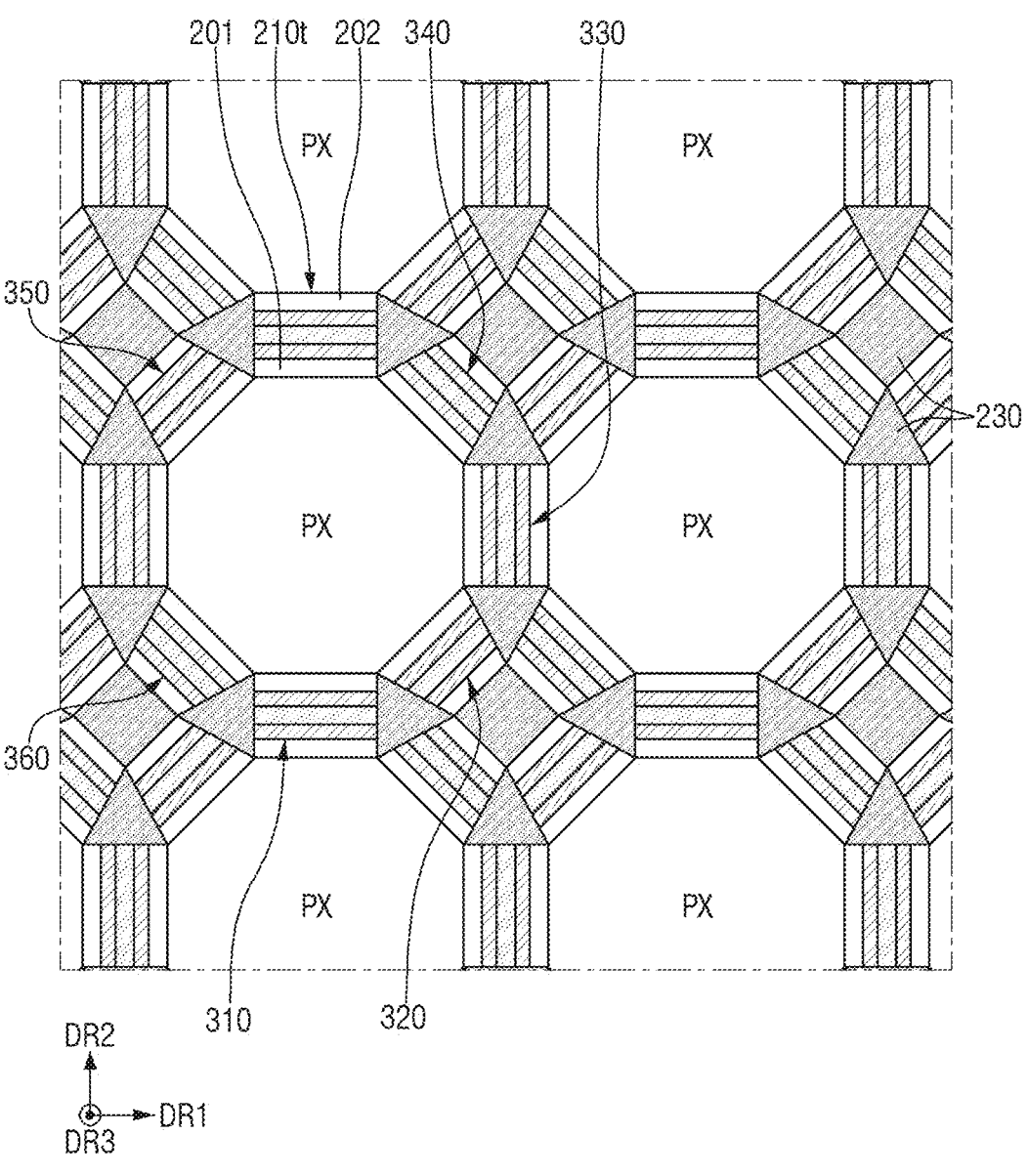

FIGS. 13 and 14 are layout views illustrating an image sensor according to some example embodiments of the present disclosure. For convenience of description, portions duplicated with those described with reference to FIGS. 1 to 6 will be described briefly or omitted.

Referring to FIG. 13, in the image sensor according to some example embodiments, a unit pixel PX may have a hexagonal shape on a plane. The first trench 210t may be formed to surround the periphery of the unit pixel PX in view of a plan. First to third capacitor structures 310, 320 and 330 may be formed in the first trench 210t. The first to third capacitor structures 310, 320 and 330 may be isolated from one another by the first capacitor isolation pattern 230. Each of the unit pixels PX1 to PX4 may include the first to third capacitor structures 310, 320 and 330.

Referring to FIG. 14, in the image sensor according to some example embodiments, the unit pixel PX may have an octagonal shape on a plane. The first trench 210t may be formed to surround the periphery of the unit pixel PX in view of a plan. First to sixth capacitor structures 310, 320, 330, 340, 350 and 360 may be formed in the first trench 210t. The first to sixth capacitor structures 310, 320, 330, 340, 350 and 360 may be isolated from one another by the first capacitor isolation pattern 230. Each of the unit pixels PX1 to PX4 may include the first to sixth capacitor structures 310, 320, 330, 340, 350 and 360.

FIGS. 13 and 14 illustrate hexagonal and octagonal shapes of unit pixel PX, however the disclosure is not limited thereto, and other shapes may be used, and in some example embodiments, a combination of different shapes may be used (such as a grid of triangles and rectangles).

Figure 15:
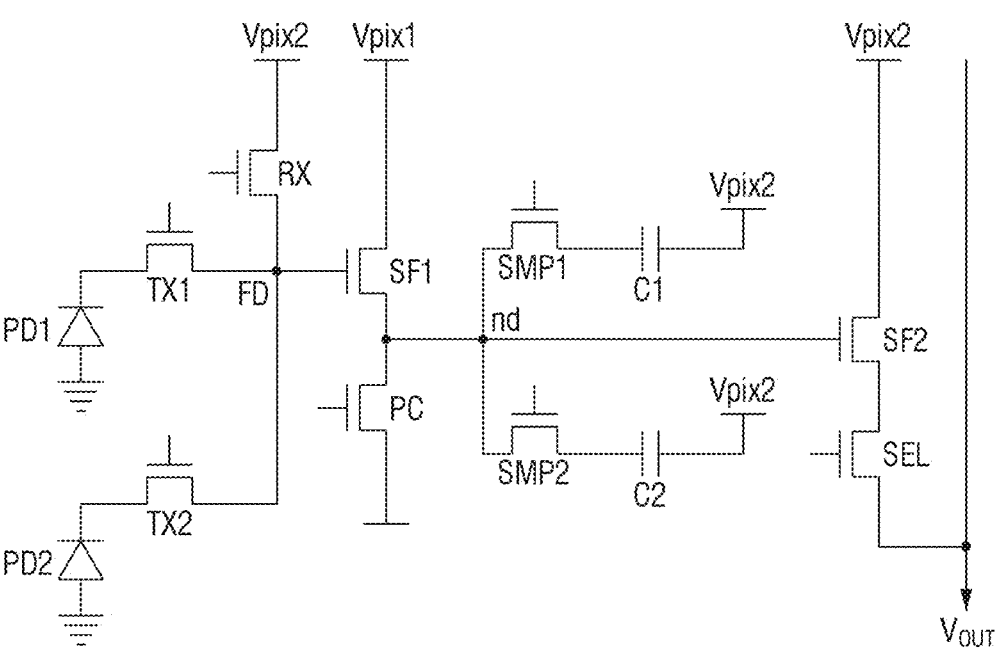
FIG. 15 is an exemplary circuit view illustrating a unit pixel of an image sensor according to some example embodiments of the present disclosure.

FIG. 15 is an exemplary circuit view illustrating a unit pixel of an image sensor according to some example embodiments of the present disclosure. For convenience of description, portions duplicated with those described with reference to FIG. 3 will be described briefly or omitted.

Referring to FIG. 15, the image sensor according to some example embodiments may include first and second photoelectric conversion elements PD1 and PD2, and first and second transfer transistors TX1 and TX2.

The first transfer transistor TX1 may be connected between the first photoelectric conversion element PD1 and the floating diffusion region FD. The second transfer transistor TX2 may be connected between the second photoelectric conversion element PD2 and the floating diffusion region FD. The first and second transfer transistors TX1 and TX2 may be independently controlled by the transmission signals. In some example embodiments, the first and second transfer transistors TX1 and TX2 may share the floating diffusion region FD.

The first and second photoelectric conversion elements PD1 and PD2 may be disposed in their respective unit pixels UP different from each other, or may be disposed in one unit pixel UP. Likewise, the first and second transfer transistors TX1 and TX2 may be disposed in their respective unit pixels UP different from each other, or may be disposed in one unit pixel UP.

Figure 16:
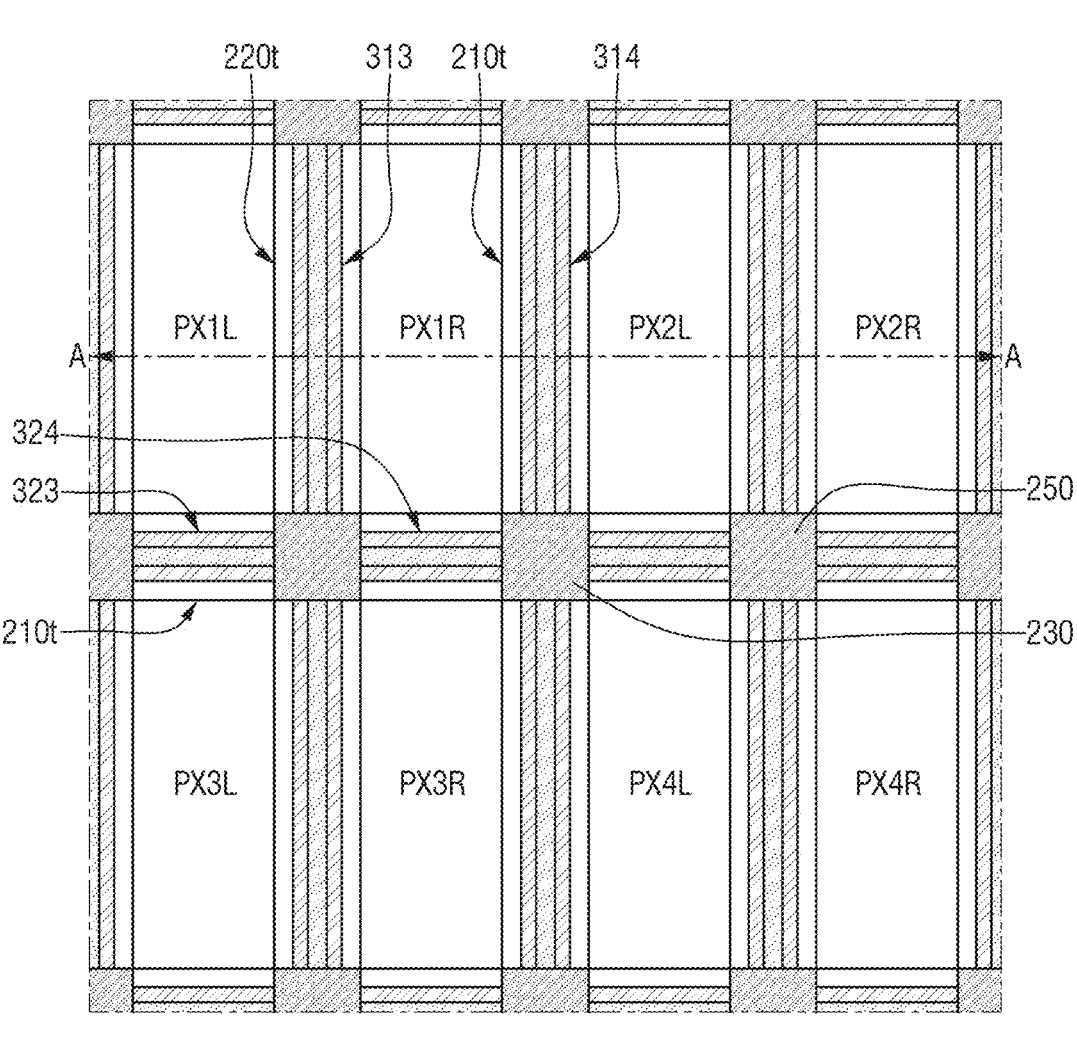
FIG. 16 is a layout view illustrating an image sensor according to some example embodiments of the present disclosure.
Figure 16:
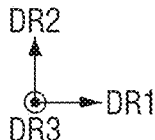
Figure 17:
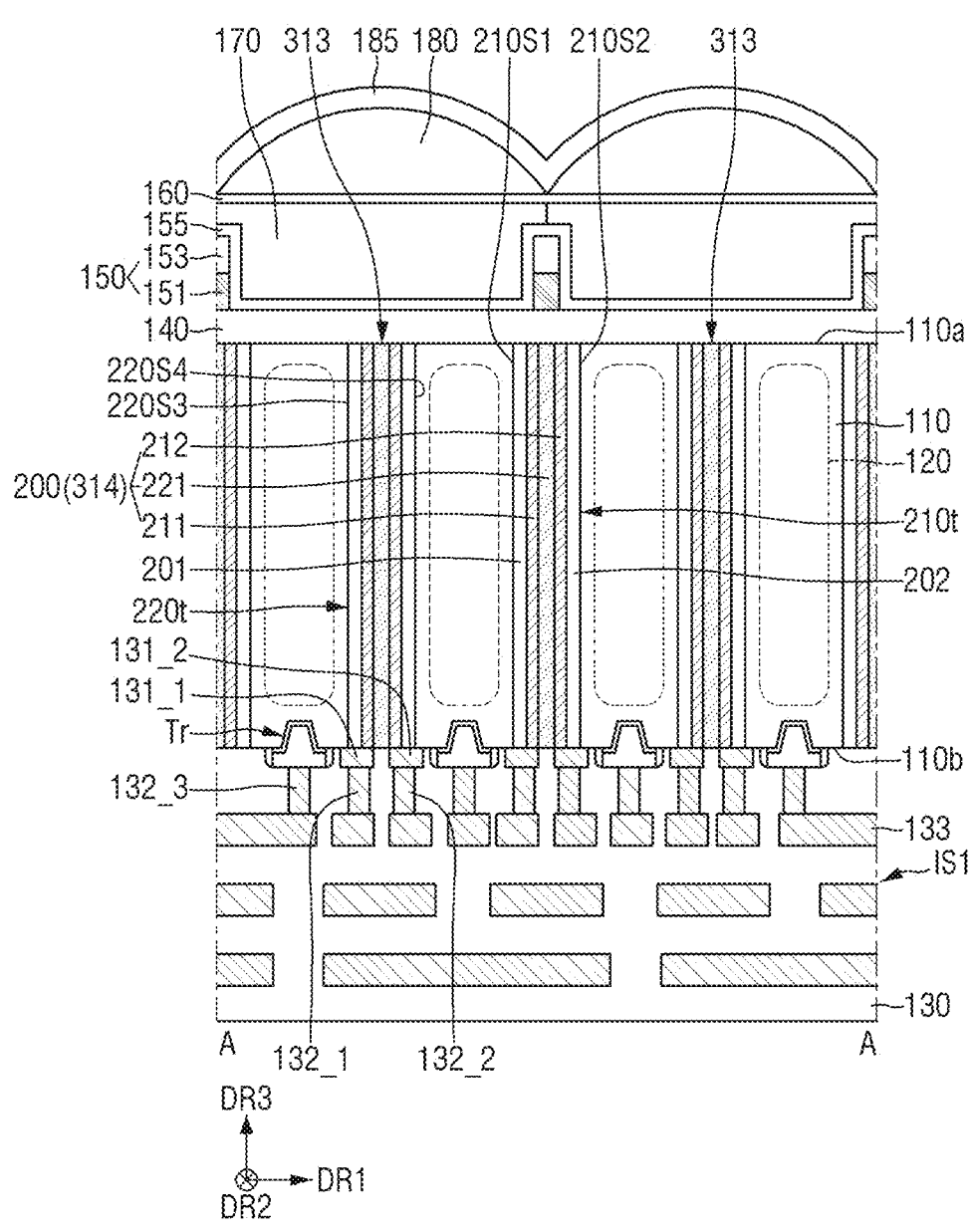
FIG. 17 is a cross-sectional view taken along line A-A of FIG. 16.

FIG. 16 is a layout view illustrating an image sensor according to some example embodiments of the present disclosure. FIG. 17 is a cross-sectional view taken along line A-A of FIG. 16. For convenience of description, portions duplicated with those described with reference to FIGS. 1 to 6 will be described briefly or omitted.

Referring to FIGS. 15 and 16, each unit pixel of the image sensor according to some example embodiments may include two subpixels. The first unit pixel may include first subpixels PX1L and PX1R, the second unit pixel may include second subpixels PX2L and PX2R, the third unit pixel may include third subpixels PX3L and PX3R, and the fourth unit pixel may include fourth subpixels PX4L and PX4R. Each of the subpixels PXL1, PX1R, PX2L, PX2R, PX3L, PX3R, PX4L and PX4R may include a photoelectric conversion element 120.

A second trench 220t may be formed in the substrate 110. The second trench 220t may be extended in the second direction DR2 in the substrate 110. The second trench 220t may isolate the respective subpixels PX1L, PX1R, PX2L, PX2R, PX3L, PX3R, PX4L and PX4R in view of a plane.

The second trench 220t may be extended from the second surface 110b to the first surface 110a of the substrate 110. The second trench 220t may include a third sidewall 220S3 and a fourth sidewall 220S4, which are opposite to each other in the substrate 110. The first sidewall 220S3 and the second sidewall 220S4 may be opposite to each other in a direction in which the second trench 220t is extended.

The first insulating layer 201 may be extended along the third sidewall 220S3 of the second trench 220t. The second insulating layer 202 may be extended along the fourth sidewall 220S4 of the second trench 220t.

The capacitor structure 200 may be formed in the second trench 220t. The capacitor structure 200 may fill the second trench 220t between the first insulating layer 201 and the second insulating layer 202.

The capacitor structure 200 may be extended along the extended direction of the second trench 220t. The capacitor structure 200 may include a first electrode 211 formed on the third sidewall 220S3 of the second trench 220t, a second electrode 212 formed on the fourth sidewall 220S4 of the second trench 220t, and a first dielectric layer 221 between the first electrode 211 and the second electrode 212. The first electrode 211 may be extended along the third sidewall 220S3, and the second electrode 212 may be extended along the fourth sidewall 220S4. The first electrode 211 may be disposed between the first insulating layer 201 and the first dielectric layer 221, and the second electrode 212 may be disposed between the first dielectric layer 221 and the second insulating layer 202.

The third capacitor isolation pattern 250 may be formed in the substrate 110. The third capacitor isolation pattern 250 may be disposed at a point where the first trench 210t and the second trench 220t cross each other.

The capacitor structure 200 may be isolated by the third capacitor isolation pattern 250. Therefore, each pixel may include a first capacitor structure 313 disposed on a right side of each of the subpixels PX1L, PX2L, PX3L and PX4L in the first direction DR1, a second capacitor structure 323 disposed on a lower surface of each of the subpixels PX1R, PX2R, PX3R and PX4R in the second direction DR2, a third capacitor structure 314 disposed on the right side of each of the subpixels PX1R, PX2R, PX3R and PX4R in the first direction DR1, and a fourth capacitor structure 324 disposed on the lower surface of each of the subpixels PX1R, PX2R, PX3R and PX4R in the second direction DR2. The first electrode 211 and the second electrode 212 of each of the first to fourth capacitor structures 313, 314, 323 and 324 may be provided with a voltage through each of the first contact 132_1 and the second contact 132_2.

Figure 18:
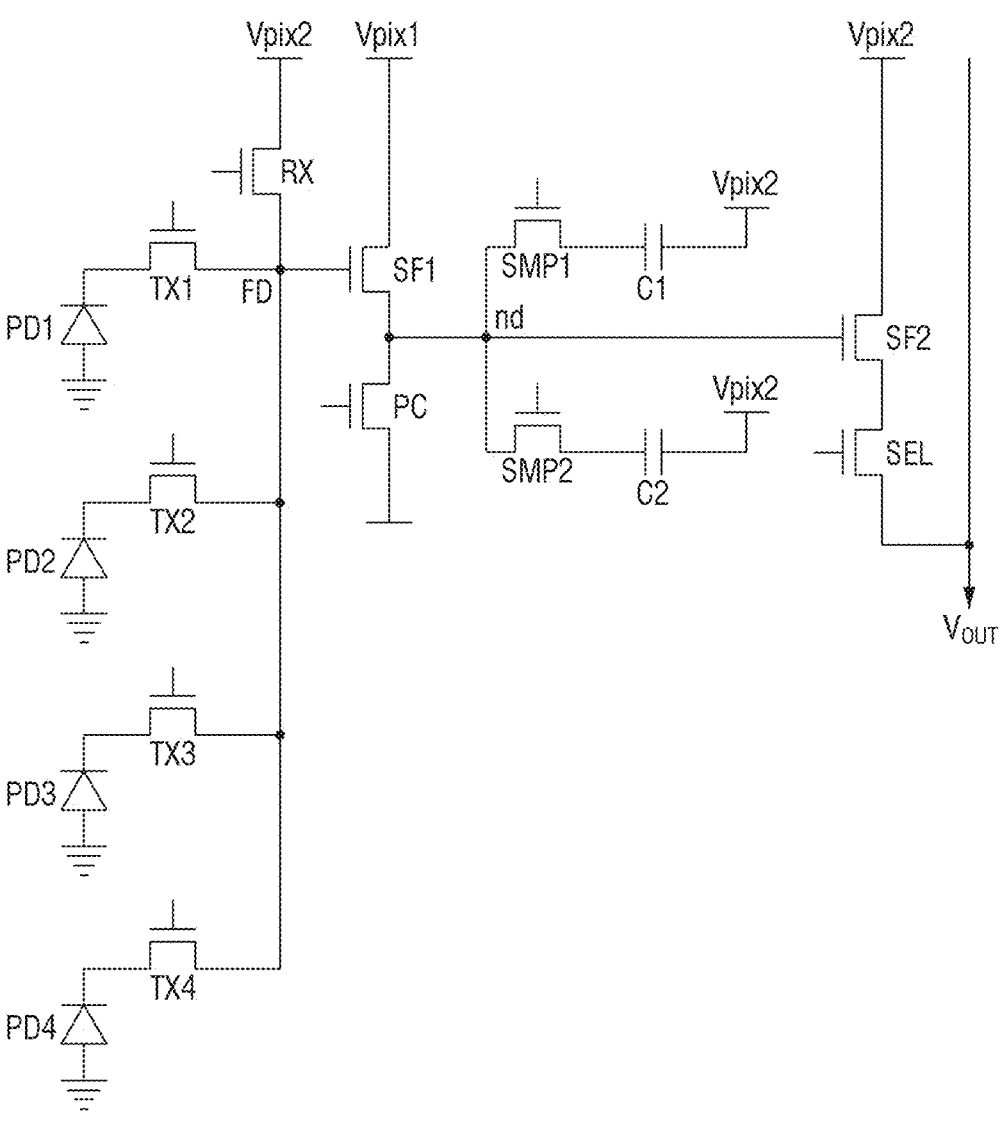
FIG. 18 is an exemplary circuit view illustrating a unit pixel of an image sensor according to some example embodiments of the present disclosure.

FIG. 18 is an exemplary circuit view illustrating a unit pixel of an image sensor according to some example embodiments of the present disclosure. For convenience of description, portions duplicated with those described with reference to FIG. 3 will be described briefly or omitted.

Referring to FIG. 18, the image sensor according to some example embodiments may include first to fourth photoelectric conversion elements PD1 to PD4 and first to fourth transfer transistors TX1 to TX4.

The third transfer transistor TX3 may be connected between the third photoelectric conversion element PD3 and the floating diffusion region FD. The fourth transfer transistor TX4 may be connected between the fourth photoelectric conversion element PD4 and the floating diffusion region FD. The first to fourth transfer transistors TX1 to TX4 may be independently controlled by the transmission signals. In some example embodiments, the first to fourth transfer transistors TX1 to TX4 may share the floating diffusion region FD.

The first to fourth photoelectric conversion elements PD1 to PD4 may be disposed in their respective unit pixels UP different from one another, or may be disposed in one unit pixel UP. Likewise, the first to fourth transfer transistors TX1 to TX4 may be disposed in their respective unit pixels XP different from one another, or may be disposed in one unit pixel XP.

Figure 19:
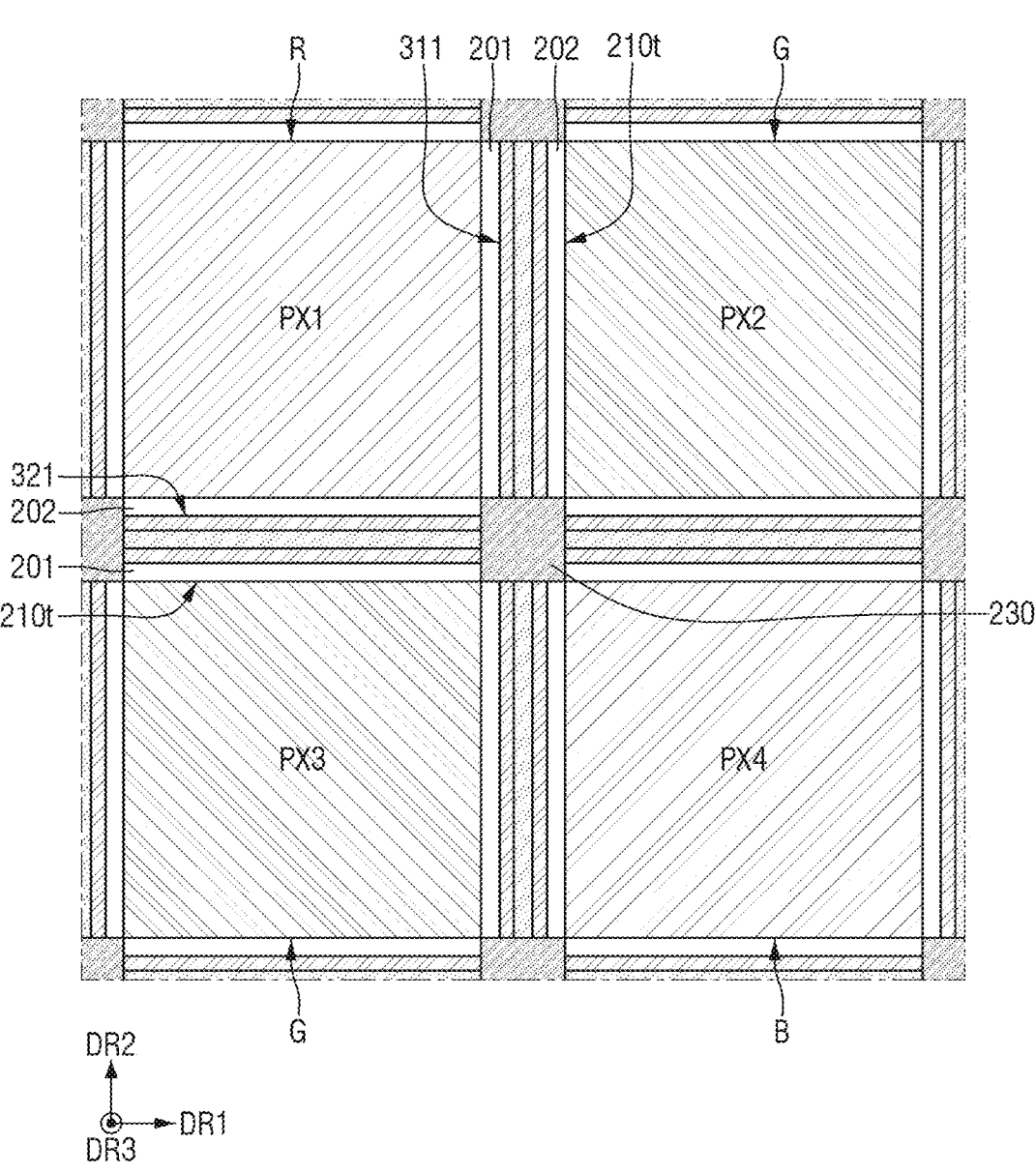
FIGS. 19 and 20 are layout views of an image sensor according to some example embodiments of the present disclosure.
Figure 20:
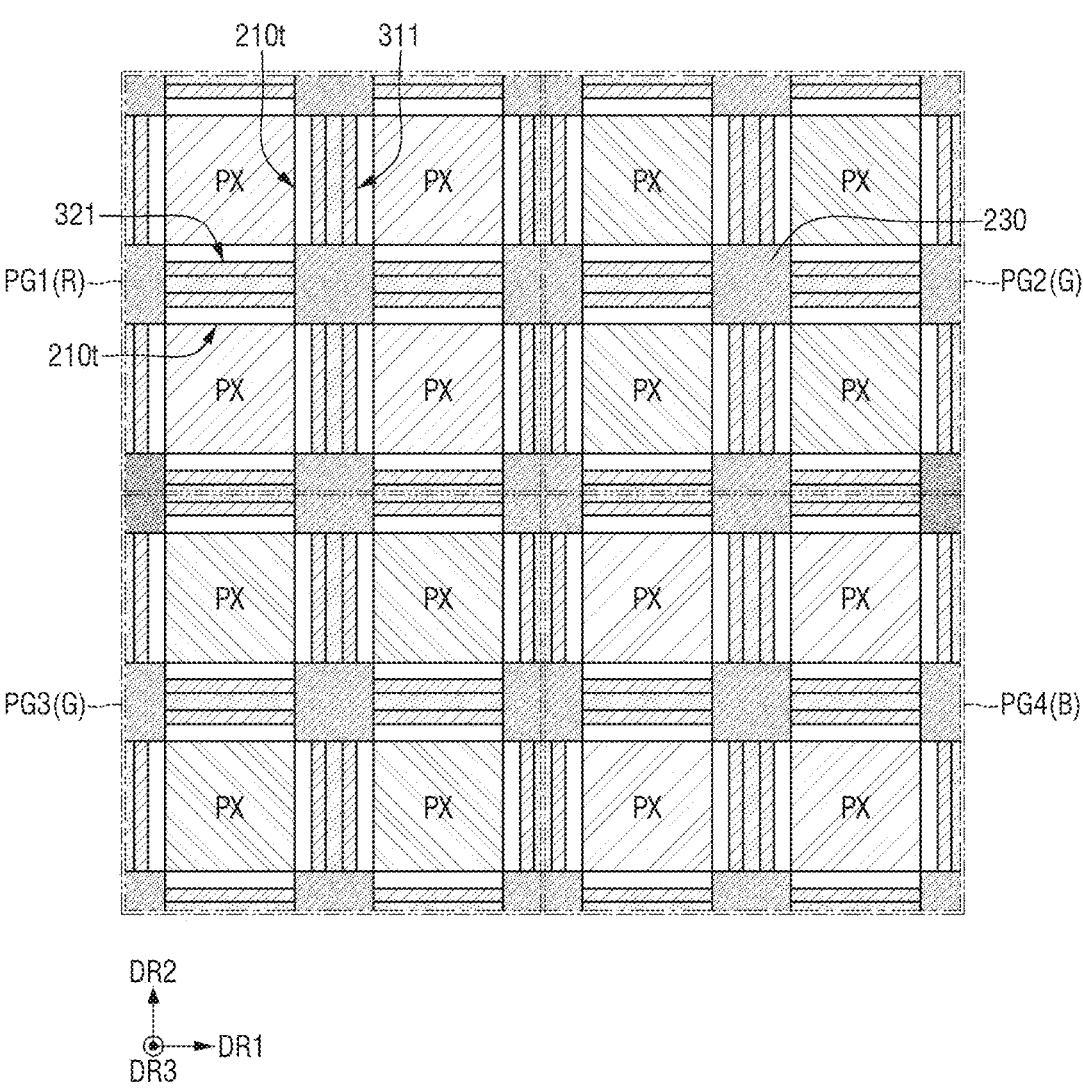

FIGS. 19 and 20 are layout views of an image sensor according to some example embodiments of the present disclosure. For convenience of description, portions duplicated with those described with reference to FIGS. 1 to 6 will be described briefly or omitted.

Referring to FIG. 19, in the image sensor according to some example embodiments, the first unit pixel PX1 and the second unit pixel PX2 sense light (e.g., light of different wavelength bands) of different colors (170 of FIG. 5).

In some example embodiments, the first to fourth unit pixels PX1 to PX4, which are adjacent to one another, may be arranged in the form of a bayer pattern. For example, the first unit pixel PX1 may sense light R of a red wavelength band, the second and third unit pixels PX2 and PX3 may sense light G of a green wavelength band, and the fourth unit pixel PX4 may sense light B of a blue wavelength band.

Referring to FIG. 20, the image sensor according to some example embodiments may include a plurality of pixel groups PG1 to PG4. The respective pixel groups PG1 to PG4 may include a plurality of unit pixels PX adjacent to one another. In addition, the pixel groups PG1 to PG4 may be arranged in two dimensions (e.g., in a matrix form) on a plane that includes a first direction DR1 and a second direction DR2.

The pixel groups PG1 to PG4 may include first to fourth pixel groups PG1 to PG4 adjacent to one another. The first pixel group PG1 and the second pixel group PG2 may be exemplarily arranged along the first direction DR1. The first pixel group PG1 and the third pixel group PG3 may be arranged along the second direction DR2. The fourth pixel group PG4 may be arranged along the second direction DR2 together with the second pixel group PG2, and may be arranged along the first direction DR1 together with the third pixel group PG3. That is, the first pixel group PG1 and the fourth pixel group PG4 may be arranged along a diagonal direction.

In some example embodiments, the first to fourth pixel groups PG1 to PG4 adjacent to one another may be arranged in the form of a bayer pattern. For example, the first pixel group PG1 may sense light B of a blue wavelength band, the second and third pixel groups PG2 and PG3 may sense light G of a green wavelength band, and the fourth pixel group PG4 may sense light R of a red wavelength band.

Figure 21:
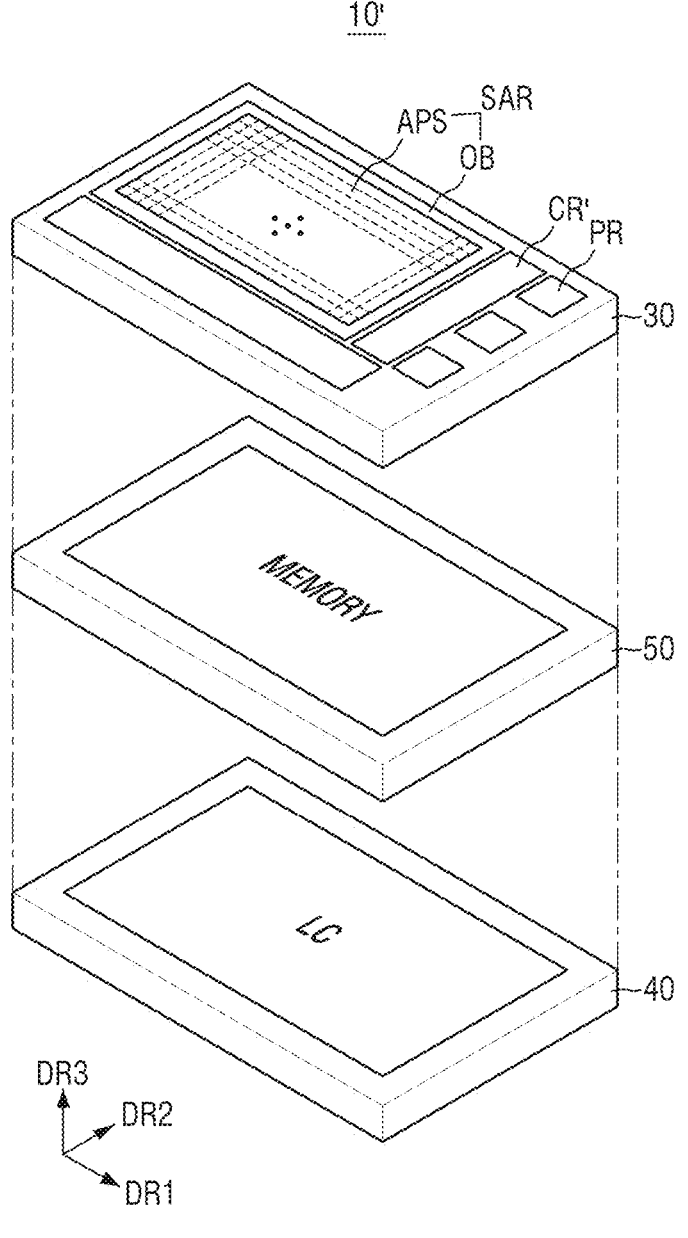
FIG. 21 is a block view illustrating an image sensor according to some example embodiments of the present disclosure.

FIG. 21 is a block view illustrating an image sensor according to some example embodiments of the present disclosure. For convenience of description, the following description will be based on a difference from the description made with reference to FIG. 2.

Referring to FIG. 21, an image sensor 10' may further include a third chip 50. The third chip 50 may be disposed between the first chip 30 and the second chip 40. The third chip 50 may include a memory device. For example, the third chip 50 may include a volatile memory device such as a DRAM, an SRAM, or the like. The third chip 50 may receive signals from the first chip 30 and the second chip 40 to process the signals through the memory device.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The image sensor 10 (portions thereof or other circuitry, for example, the timing generator 12, RAMP signal generator 13, readout circuit 16, buffer 17, image signal processor 20, second chip 40, third chip 50) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although some of the example embodiments of the present disclosure have been described with reference to the accompanying drawings, it will be apparent to those skilled in the art that the present disclosure can be manufactured in various forms without being limited to the above-described embodiments and can be embodied in other specific forms without departing from technical spirits and essential characteristics of the present disclosure. Thus, the above embodiments are to be considered in all respects as illustrative and not restrictive.

What is claimed is:

1. An image sensor comprising:
a substrate;
a plurality of unit pixels, each of the plurality of unit pixels including a photoelectric conversion element in the substrate, the substrate defining a first trench in a lattice shape to isolate the plurality of unit pixels;
a plurality of first capacitor structures extended within the first trench, including a first electrode layer on a first sidewall of the first trench, a second electrode layer on a second sidewall of the first trench, and a first dielectric layer extending to a bottommost surface of the first trench and separating the first electrode layer and the second electrode layer, the first dielectric layer separated from the first sidewall and the second sidewall, the first electrode layer including one of a metal layer or a metal nitride layer, the second electrode layer including one of a metal layer or a metal nitride layer; and a plurality of first capacitor isolation patterns at respective lattice points of the first trench to isolate the plurality of first capacitor structures.

2. The image sensor of claim 1, further comprising:

a second capacitor isolation pattern between ones of the plurality of the first capacitor isolation patterns adjacent to each other to isolate the plurality of first capacitor structures.

3. The image sensor of claim 2, wherein a distance between the second capacitor isolation pattern and a respective one of the plurality of first capacitor isolation patterns adjacent to one side of the second capacitor isolation pattern is same as a distance between the second capacitor isolation pattern and another respective one of the plurality of first capacitor isolation patterns adjacent to another side of the second capacitor isolation pattern.

4. The image sensor of claim 2, wherein a distance between the second capacitor isolation pattern and a respective one of the plurality of first capacitor isolation patterns adjacent to one side of the second capacitor isolation pattern is different from a distance between the second capacitor isolation pattern and another respective one of the plurality of first capacitor isolation patterns adjacent to another side of the second capacitor isolation pattern.

5. The image sensor of claim 1, wherein each of the plurality of first capacitor isolation patterns includes a same material as that of the substrate.

6. The image sensor of claim 1, wherein each of the plurality of the first capacitor isolation patterns includes a material different from that of the substrate.

7. The image sensor of claim 1, further comprising:

a first insulating layer extended along the first sidewall of the first trench and a second insulating layer extended along the second sidewall of the first trench, wherein the first electrode layer is between the first insulating layer and the first dielectric layer, and the second electrode layer is between the first dielectric layer and the second insulating layer.

8. The image sensor of claim 1, wherein each of the plurality of first capacitor structures includes a second dielectric layer and a third electrode layer, which are extended along and within the first trench, the second dielectric layer being between the second electrode layer and the third electrode layer.

9. The image sensor of claim 1, wherein any one of the plurality of unit pixels includes a first subpixel and a second subpixel, the substrate defines a second trench to isolate the first subpixel from the second subpixel, and each of the first and second subpixels includes the photoelectric conversion element, and further includes:

a second capacitor structure extended along a sidewall of the second trench in the second trench, including a third electrode layer, a fourth electrode layer, and a second dielectric layer between the third electrode layer and the fourth electrode layer; and a second capacitor isolation pattern at a point where the second trench and the first trench cross each other to isolate the plurality of first capacitor structures from the second capacitor structure.

10. An image sensor comprising:

a substrate;

a first unit pixel and a second unit pixel adjacent to the first unit pixel in a first direction, the substrate defining a first trench extended in a second direction inside the substrate to isolate the first unit pixel from the second unit pixel, including a first sidewall and a second sidewall, which are opposite to each other in the first direction; and a first capacitor structure including a first electrode layer on and extended along the first sidewall of the first trench, a second electrode layer on and extended along the second sidewall of the first trench, and a first dielectric layer extending to a bottommost surface of the first trench and separating the first electrode layer and the second electrode layer, the first dielectric layer separated from the first sidewall and the second sidewall, the first electrode layer including one of a metal layer or a metal nitride layer, the second electrode layer including one of a metal layer or a metal nitride layer.

11. The image sensor of claim 10, wherein the first unit pixel includes a first subpixel including a first photoelectric conversion element and a second subpixel including a second photoelectric conversion element, and the substrate defines a second trench extended in the second direction to isolate the first subpixel from the second subpixel, including a third sidewall and a fourth sidewall, which are opposite to each other in the first direction, the first unit pixel further includes:

a second capacitor structure including a fifth electrode layer extended along the third sidewall of the second trench, a sixth electrode layer extended along the fourth sidewall of the second trench, and a third dielectric layer between the fifth electrode layer and the sixth electrode layer.

12. The image sensor of claim 11, wherein the second trench penetrates the substrate in the second direction.

13. The image sensor of claim 10, further comprising:

a first color filter corresponding to the first unit pixel on the substrate; and a second color filter corresponding to the second unit pixel on the substrate, isolated from the first color filter, wherein the first color filter is configured to sense a same color as that of the second color filter.

14. The image sensor of claim 10, further comprising:

a first color filter corresponding to the first unit pixel on the substrate; and a second color filter corresponding to the second unit pixel on the substrate, isolated from the first color filter, wherein the first color filter is configured to sense a color different from that of the second color filter.

15. The image sensor of claim 10, wherein the first capacitor structure includes:

a third electrode layer extended along the second sidewall of the first trench in the first trench; and a second dielectric layer between the second electrode layer and the third electrode layer.

16. The image sensor of claim 10, wherein the first trench and the first capacitor structure penetrate the substrate in the second direction.

17. The image sensor of claim 16, further comprising a wiring structure on a second surface of the substrate, wherein the wiring structure includes:

a first pad connected to the first electrode layer on the second surface of the substrate;

a second pad connected to the second electrode layer on the second surface of the substrate;

a first contact on the first pad; and a second contact on the second pad.

18. The image sensor of claim 10, further comprising:

a first insulating layer extended along the first sidewall of the first trench; and a second insulating layer extended along the second sidewall of the first trench, wherein the first electrode layer is between the first insulating layer and the first dielectric layer, and the second electrode layer is between the first dielectric layer and the second insulating layer.

19. An image sensor comprising:

a substrate including a first surface and a second surface, which are opposite to each other;

a plurality of unit pixels, each of the plurality of unit pixels including a photoelectric conversion element in the substrate, the substrate defining a first trench surrounding a periphery of each of the plurality of unit pixels inside the substrate and isolating the plurality of unit pixels;

a first insulating layer on a first sidewall of the first trench;

a second insulating layer on a second sidewall of the first trench;

a plurality of first capacitor structures filling the first trench between the first insulating layer and the second insulating layer, within the first trench and extended along an extended direction of the first trench, and including a first electrode layer on the first sidewall of the first trench, a second electrode layer on the second sidewall of the first trench, and a first dielectric layer extending to a bottommost surface of the first trench and separating the first electrode layer and the second electrode layer, the first dielectric layer separated from the first sidewall and the second sidewall, the first electrode layer including one of a metal layer or a metal nitride layer, the second electrode layer including one of a metal layer or a metal nitride layer;

a plurality of first capacitor isolation patterns at respective intersection points of the first trench to isolate the plurality of first capacitor structures;

a wiring structure on the second surface of the substrate, including a first contact connected to the first electrode layer and a second contact connected to the second electrode layer; and a color filter and a micro lens, which are sequentially stacked on the first surface of the substrate.

20. The image sensor of claim 19, wherein each of the plurality of unit pixels has a polygonal shape.

* * * * *